US012604723B2

(12) United States Patent
Wang et al.

(10) Patent No.: US 12,604,723 B2
(45) Date of Patent: Apr. 14, 2026

(54) METAL CAPPING LAYER FOR REDUCING GATE RESISTANCE IN SEMICONDUCTOR DEVICES

(71) Applicant: Taiwan Semiconductor Manufacturing Company, Ltd., Hsin-Chu (TW)

(72) Inventors: Wei-Cheng Wang, Hsinchu County (TW); Shih-Hang Chiu, Taichung City (TW); Kuan-Ting Liu, Hsinchu City (TW); Chi On Chui, Hsinchu City (TW); Chia-Wei Chen, Hsinchu (TW); Jian-Hao Chen, Hsinchu City (TW)

(73) Assignee: TAIWAN SEMICONDICTOR MANUFACTURING COMPANY, LTD, Hsinchu (TW)

( * ) Notice: Subject to any disclaimer, the term of this patent is extended or adjusted under 35 U.S.C. 154(b) by 715 days.

(21) Appl. No.: 17/738,238

(22) Filed: May 6, 2022

(65) Prior Publication Data

US 2023/0016381 A1     Jan. 19, 2023

Related U.S. Application Data

(60) Provisional application No. 63/219,914, filed on Jul. 9, 2021.

(51) Int. Cl.
*H01L 23/528* (2006.01)
*H01L 21/768* (2006.01)
(Continued)

(52) U.S. Cl.
CPC ...... *H01L 23/5283* (2013.01); *H01L 21/7682* (2013.01); *H01L 21/7684* (2013.01); *H01L 21/76877* (2013.01); *H01L 23/53266*

(2013.01); *H10D 30/031* (2025.01); *H10D 30/6735* (2025.01); *H10D 30/6757* (2025.01);
(Continued)

(58) Field of Classification Search
CPC ........... H01L 23/5283; H01L 23/53266; H01L 21/7682; H01L 21/7684; H01L 21/76877; H01L 29/0665; H01L 29/401; H01L 29/72392; H01L 29/66742;
(Continued)

(56) References Cited

U.S. PATENT DOCUMENTS

| | | | |
|---|---|---|---|
| 10,418,453 B2 | 9/2019 | Wang et al. | |
| 10,923,573 B2 | 2/2021 | Wang et al. | |
| (Continued) | | | |

*Primary Examiner* — Christine A Enad
(74) *Attorney, Agent, or Firm* — HAYNES AND BOONE, LLP

(57) ABSTRACT

A semiconductor structure includes a semiconductor fin protruding from a substrate; a gate structure engaging with the semiconductor fin. The semiconductor structure also includes an interlayer dielectric (ILD) layer disposed over the substrate and adjacent to the gate structure, where a top surface of the gate structure is below a top surface of the ILD layer; a first metal layer in direct contact with a top surface of the gate structure; a second metal layer disposed over the first metal layer, where the first metal layer is disposed on bottom and sidewall surfaces of the second metal layer, where the bottom surface of the second metal layer has a concave profile, and where the second metal layer differs from the first metal layer in composition; and a gate contact disposed over the second metal layer.

20 Claims, 23 Drawing Sheets

(51) Int. Cl.

| | |
|---|---|
| *H01L 23/532* | (2006.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ........... *H10D 62/118* (2025.01); *H10D 64/01* (2025.01); *H01L 21/76843* (2013.01); *H01L 23/53223* (2013.01); *H01L 23/53238* (2013.01); *H10D 84/0149* (2025.01); *H10D 84/038* (2025.01); *H10D 84/83* (2025.01)

(58) Field of Classification Search
CPC .......... H01L 29/78696; H10D 30/6757; H10D 64/01; H10D 62/118; H10D 30/6735
See application file for complete search history.

(56) References Cited

U.S. PATENT DOCUMENTS

| | | | | |
|---|---|---|---|---|
| 2008/0185637 | A1* | 8/2008 | Nagaoka | H01L 29/66545 |
| | | | | 257/E21.409 |
| 2012/0187460 | A1* | 7/2012 | Lavoie | H10D 30/601 |
| | | | | 438/293 |
| 2018/0315652 | A1* | 11/2018 | Tsai | H01L 29/4966 |
| 2019/0131426 | A1* | 5/2019 | Lu | H01L 29/6684 |
| 2020/0091309 | A1* | 3/2020 | Lin | H01L 29/4991 |
| 2020/0098922 | A1* | 3/2020 | You | H01L 29/6681 |
| 2021/0167179 | A1 | 6/2021 | Wang et al. | |
| 2022/0077292 | A1* | 3/2022 | Bae | H10D 64/017 |

\* cited by examiner

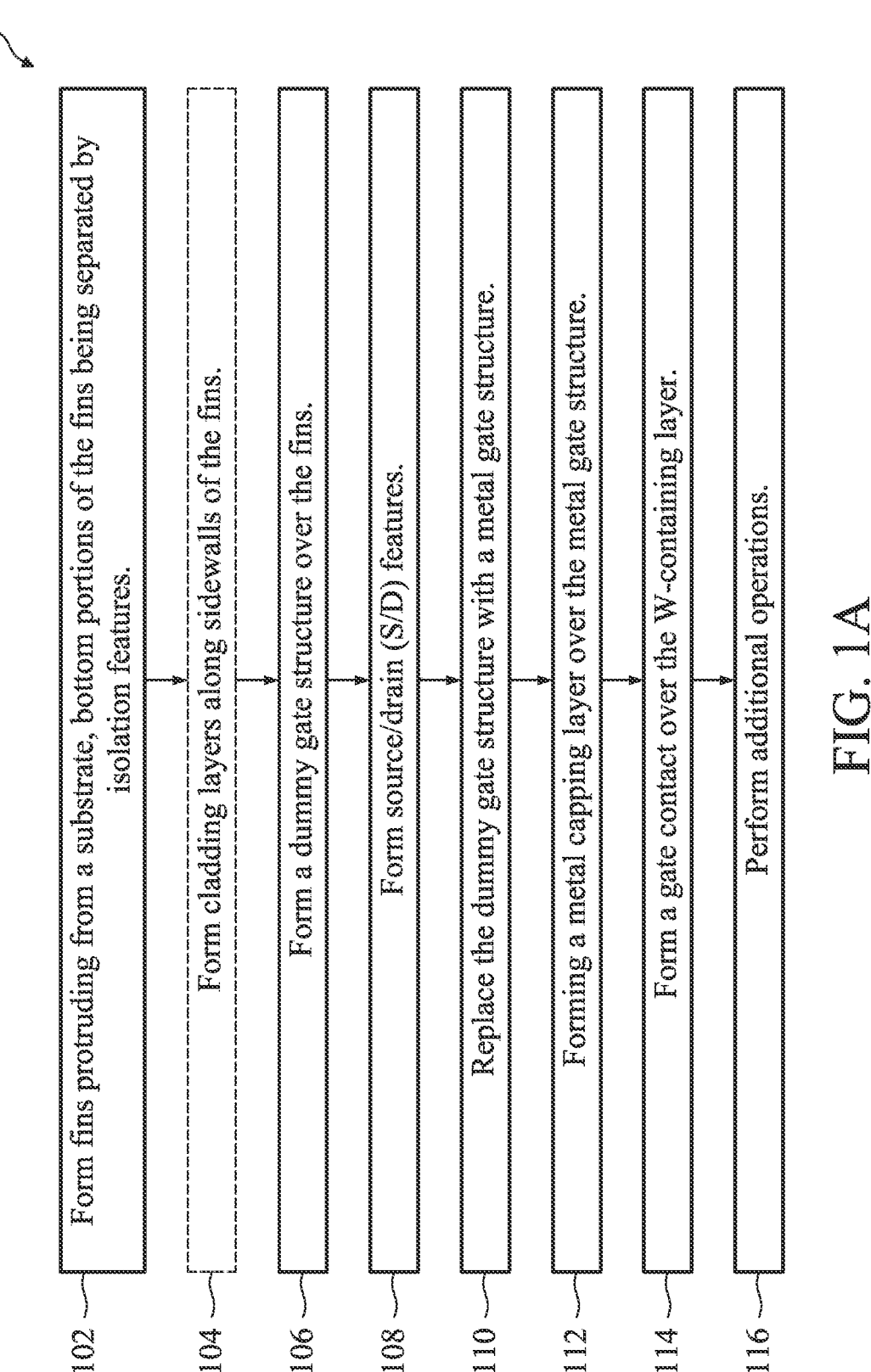

100

102 — Form fins protruding from a substrate, bottom portions of the fins being separated by isolation features.

104 — Form cladding layers along sidewalls of the fins.

106 — Form a dummy gate structure over the fins.

108 — Form source/drain (S/D) features.

110 — Replace the dummy gate structure with a metal gate structure.

112 — Forming a metal capping layer over the metal gate structure.

114 — Form a gate contact over the W-containing layer.

116 — Perform additional operations.

FIG. 1A

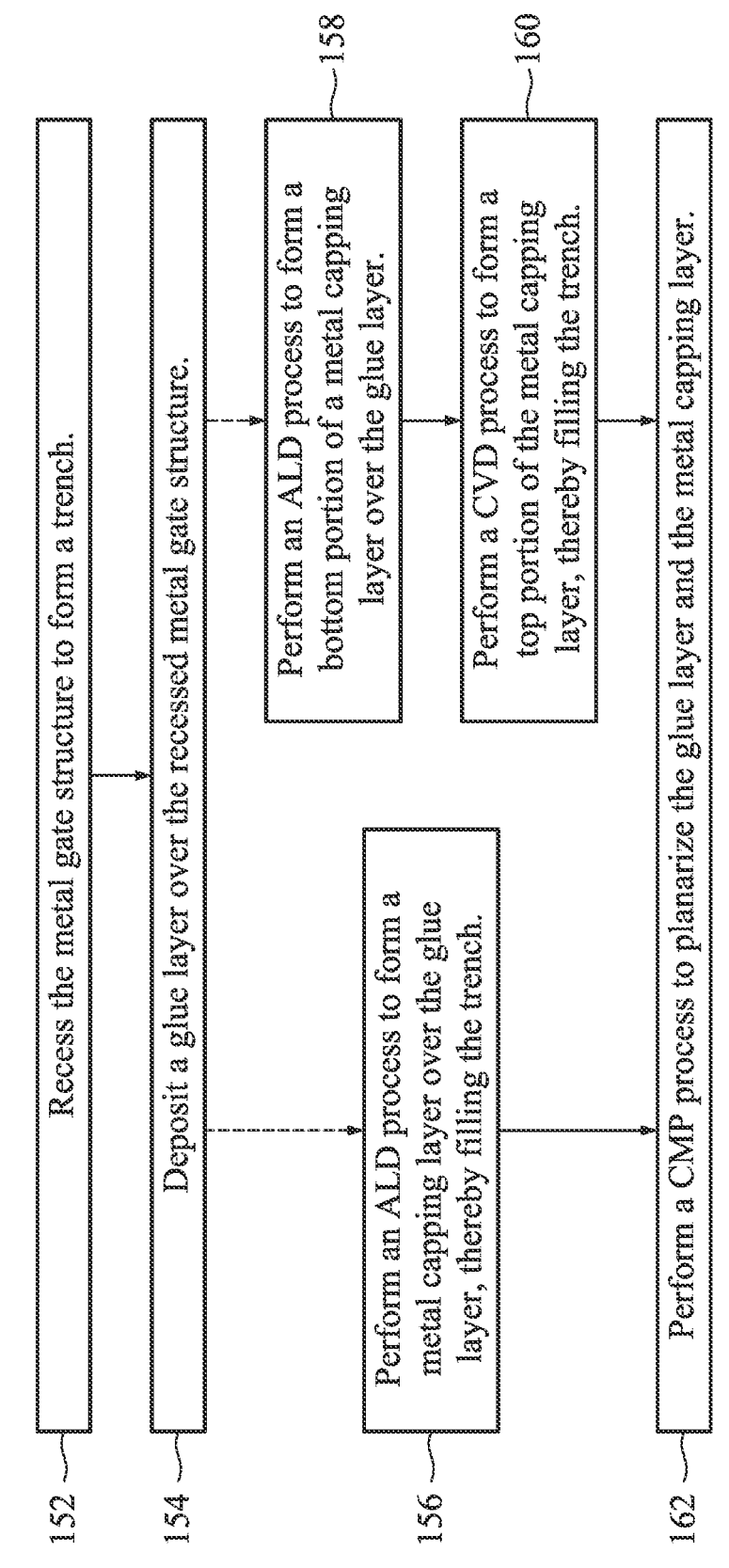

150

152 — Recess the metal gate structure to form a trench.

154 — Deposit a glue layer over the recessed metal gate structure.

156 — Perform an ALD process to form a metal capping layer over the glue layer, thereby filling the trench.

158 — Perform an ALD process to form a bottom portion of a metal capping layer over the glue layer.

160 — Perform a CVD process to form a top portion of the metal capping layer, thereby filling the trench.

162 — Perform a CMP process to planarize the glue layer and the metal capping layer.

FIG. 1B

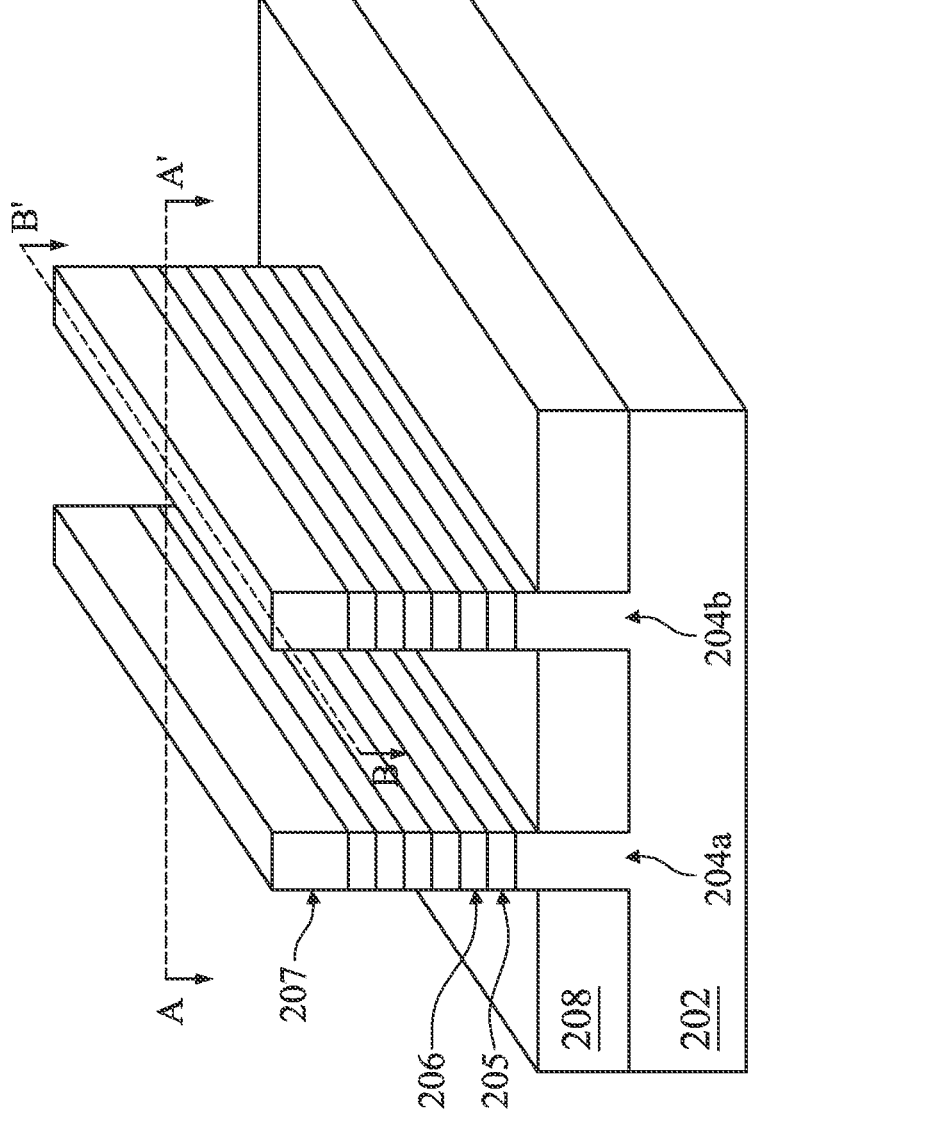
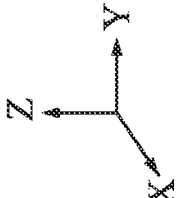
FIG. 2

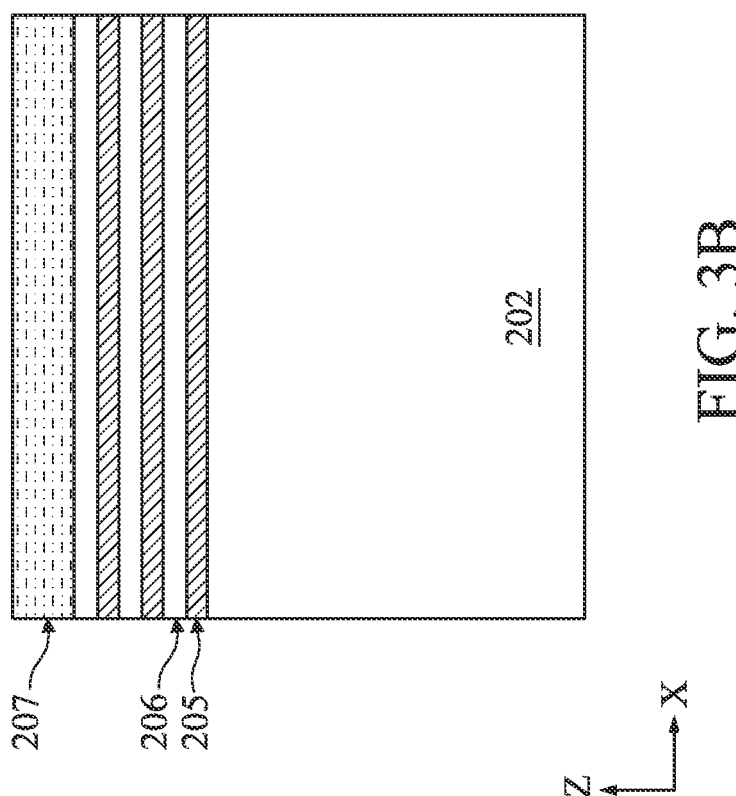
FIG. 3B
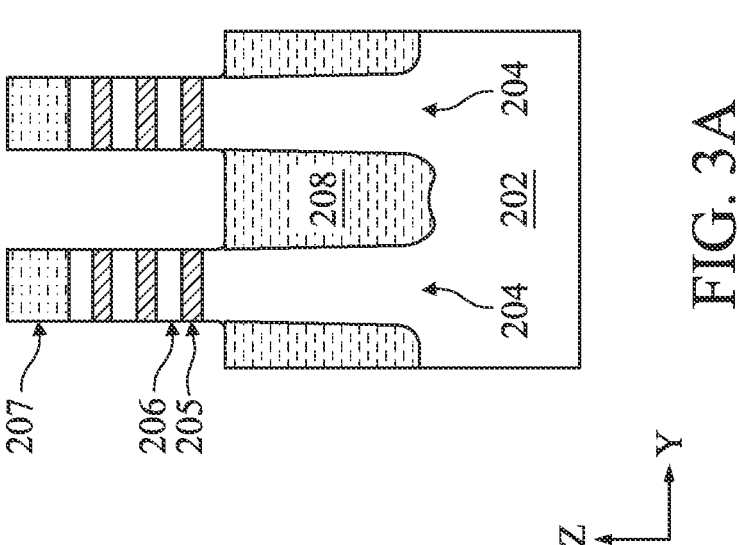
FIG. 3A

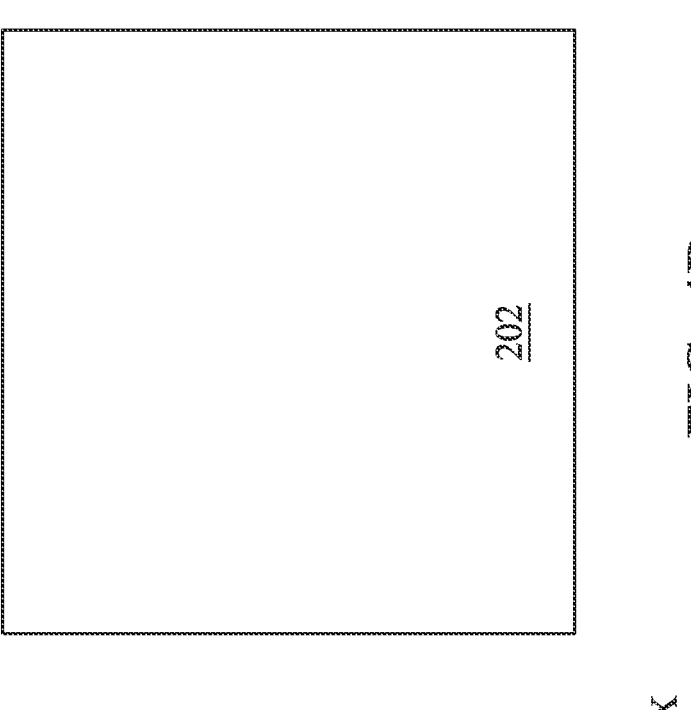
FIG. 4B
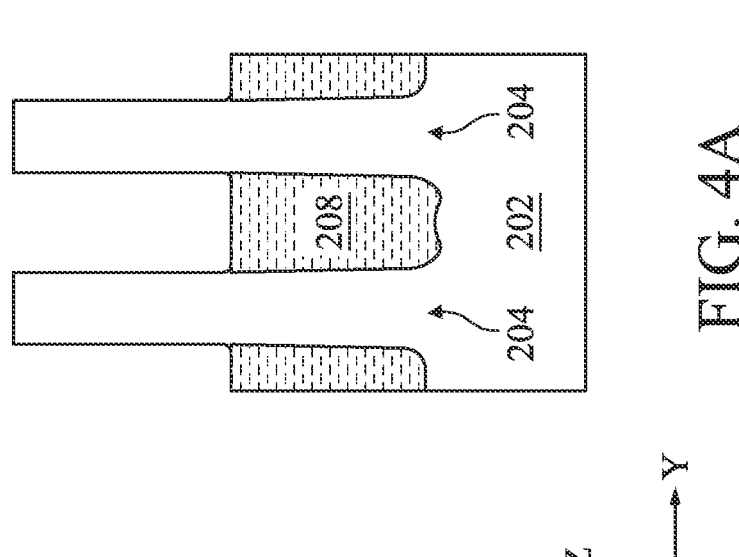
FIG. 4A

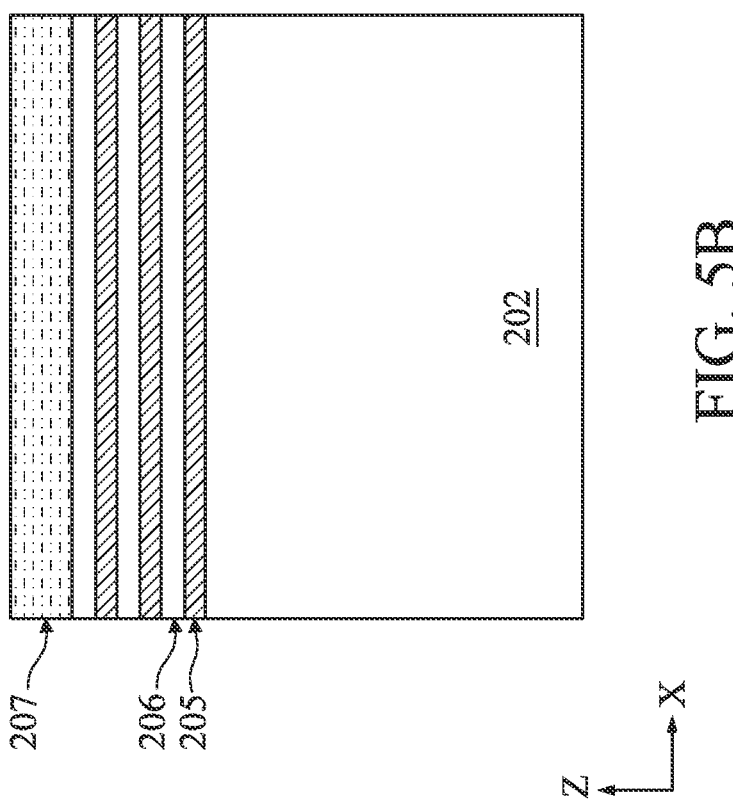
FIG. 5B
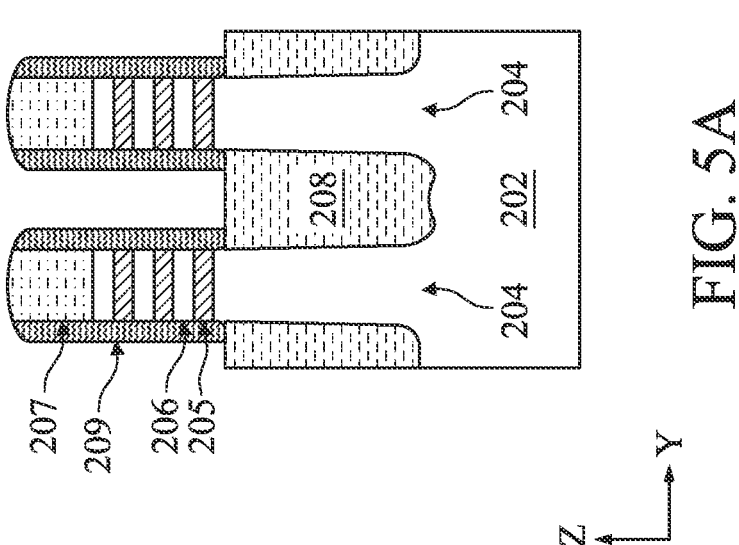
FIG. 5A

200

206
205

202

Z
X

200

214
211b } 211
211a 209
206
205

204

208

204

202

Z
Y

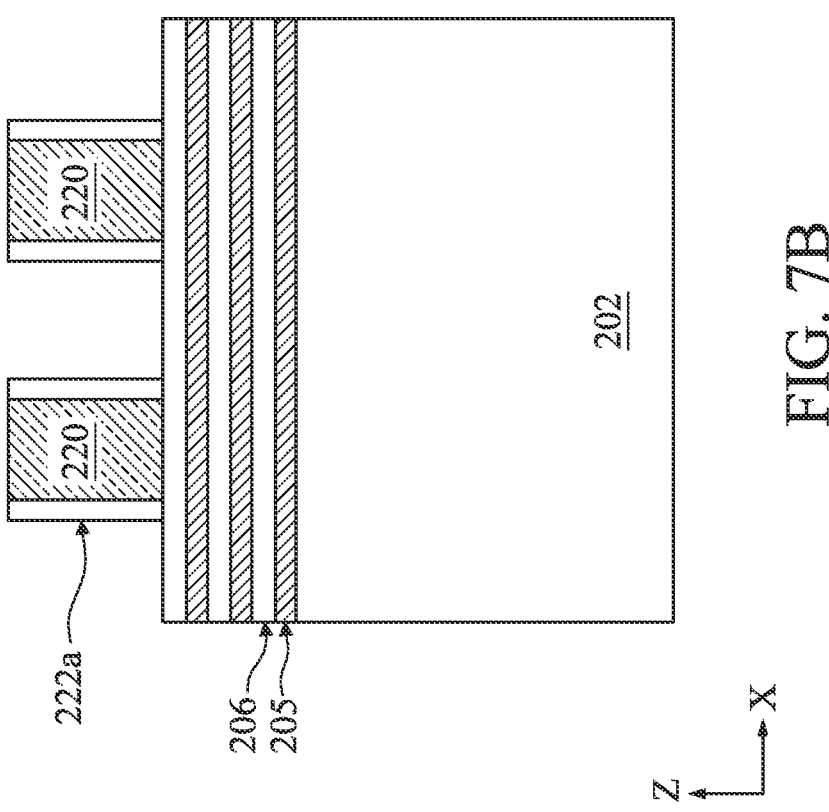
FIG. 7B
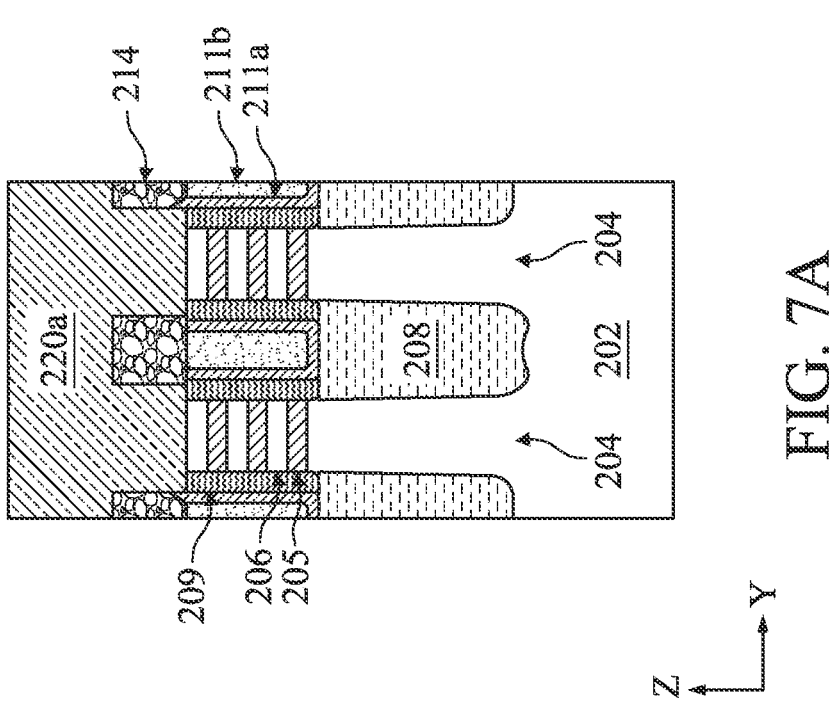
FIG. 7A

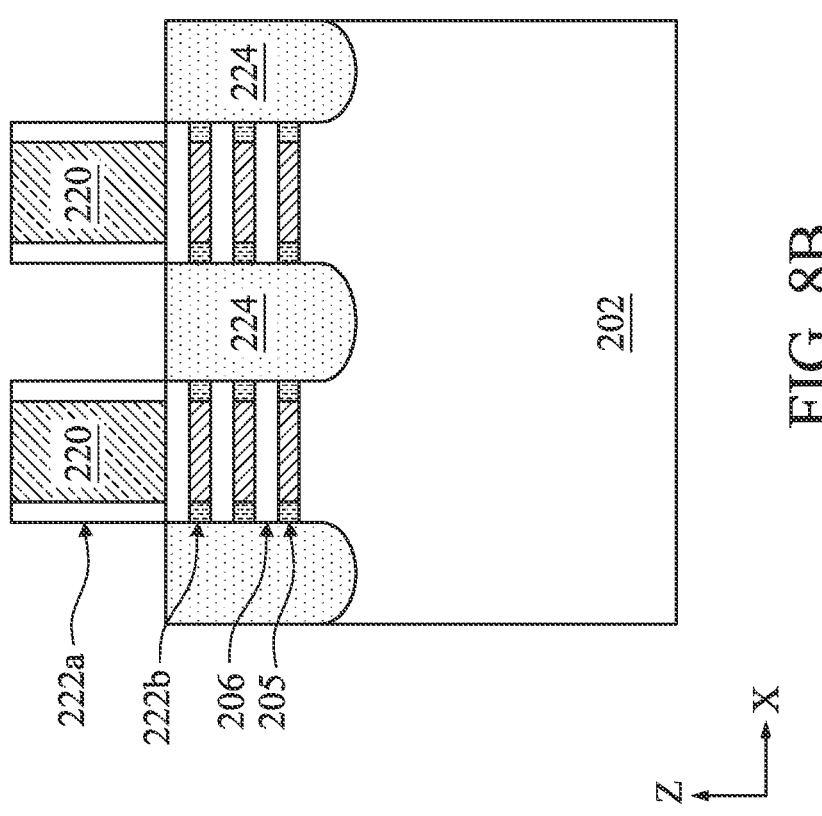
FIG. 8B
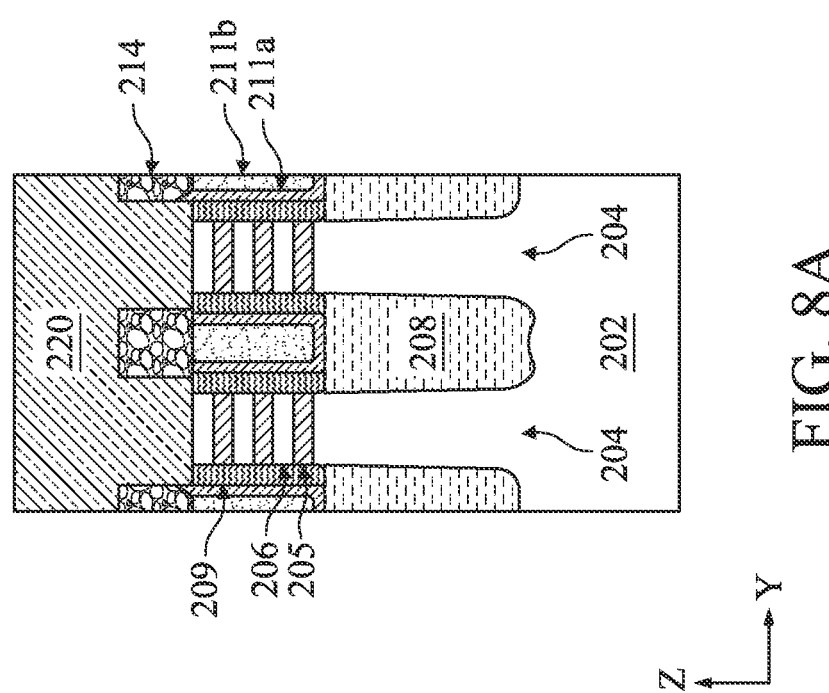
FIG. 8A

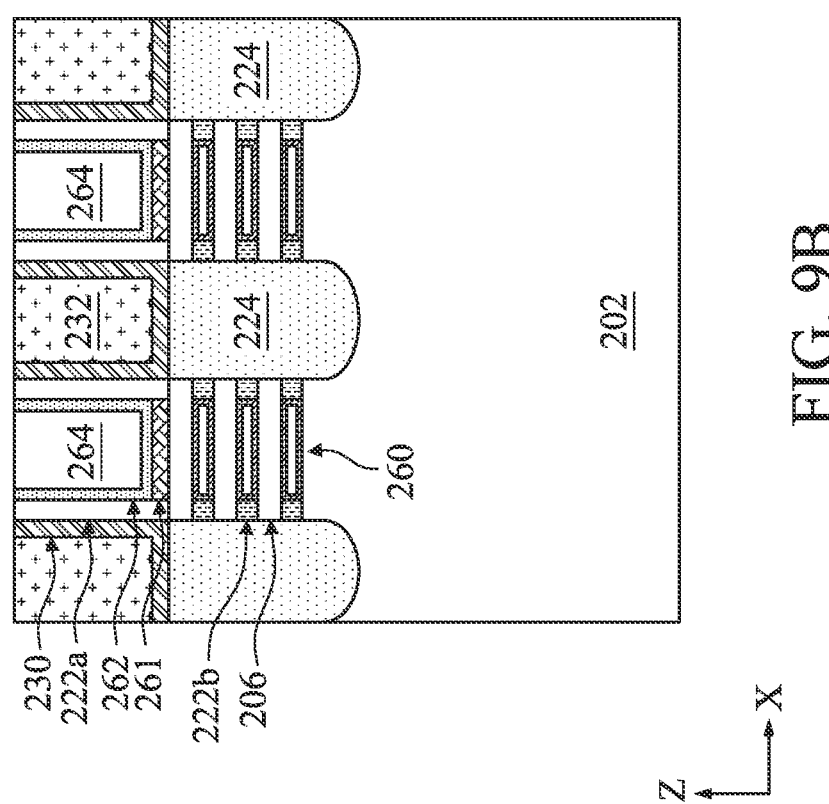
FIG. 9B
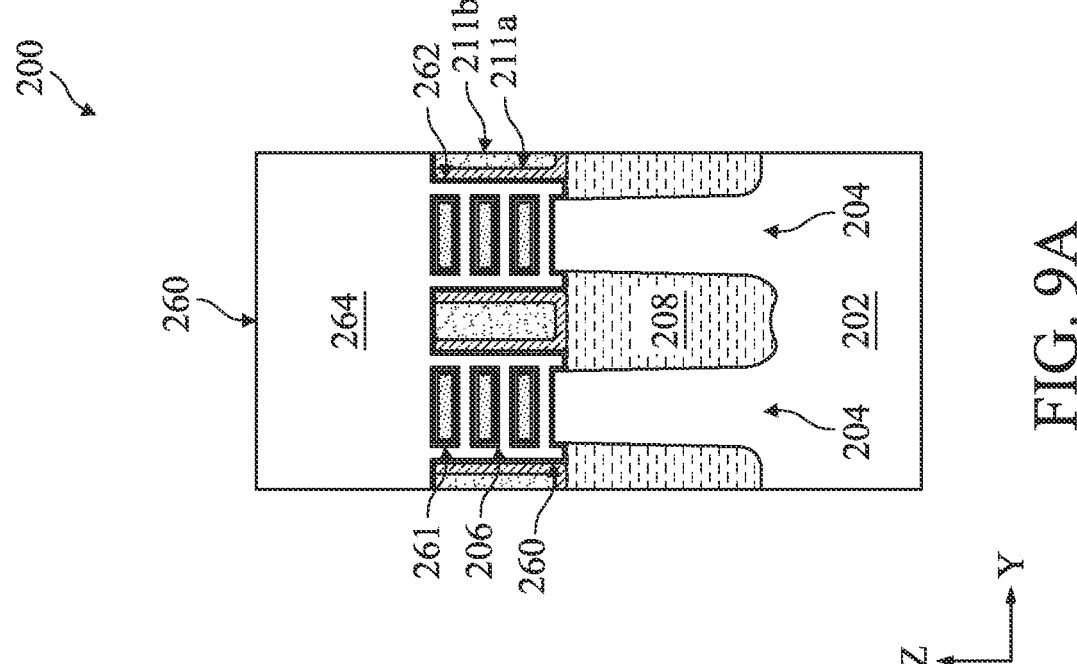
FIG. 9A

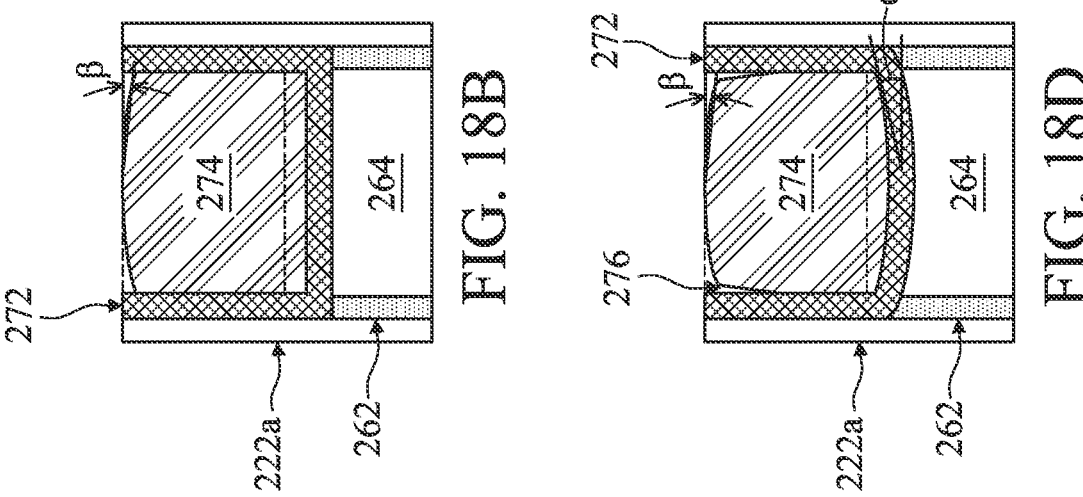
FIG. 18B
FIG. 18D
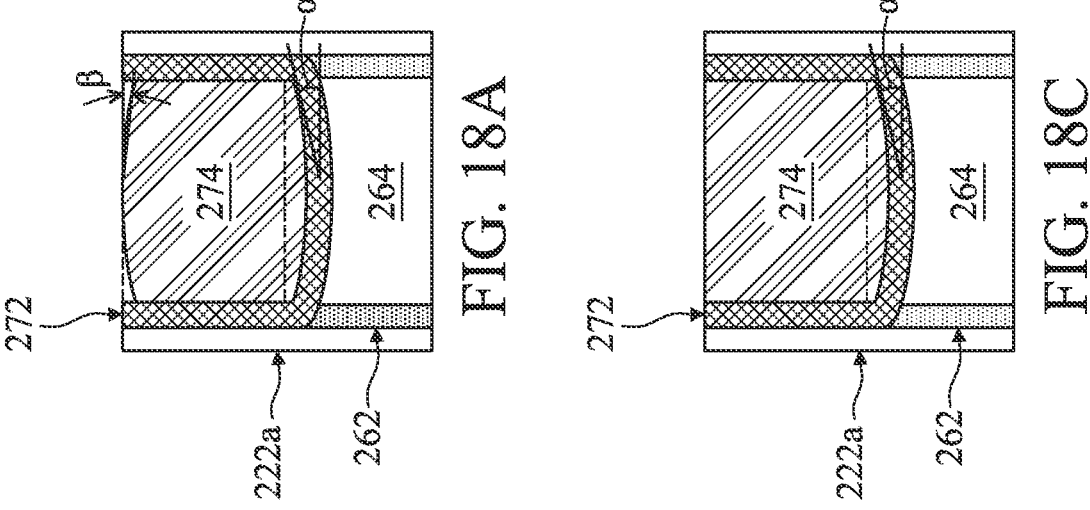
FIG. 18A
FIG. 18C

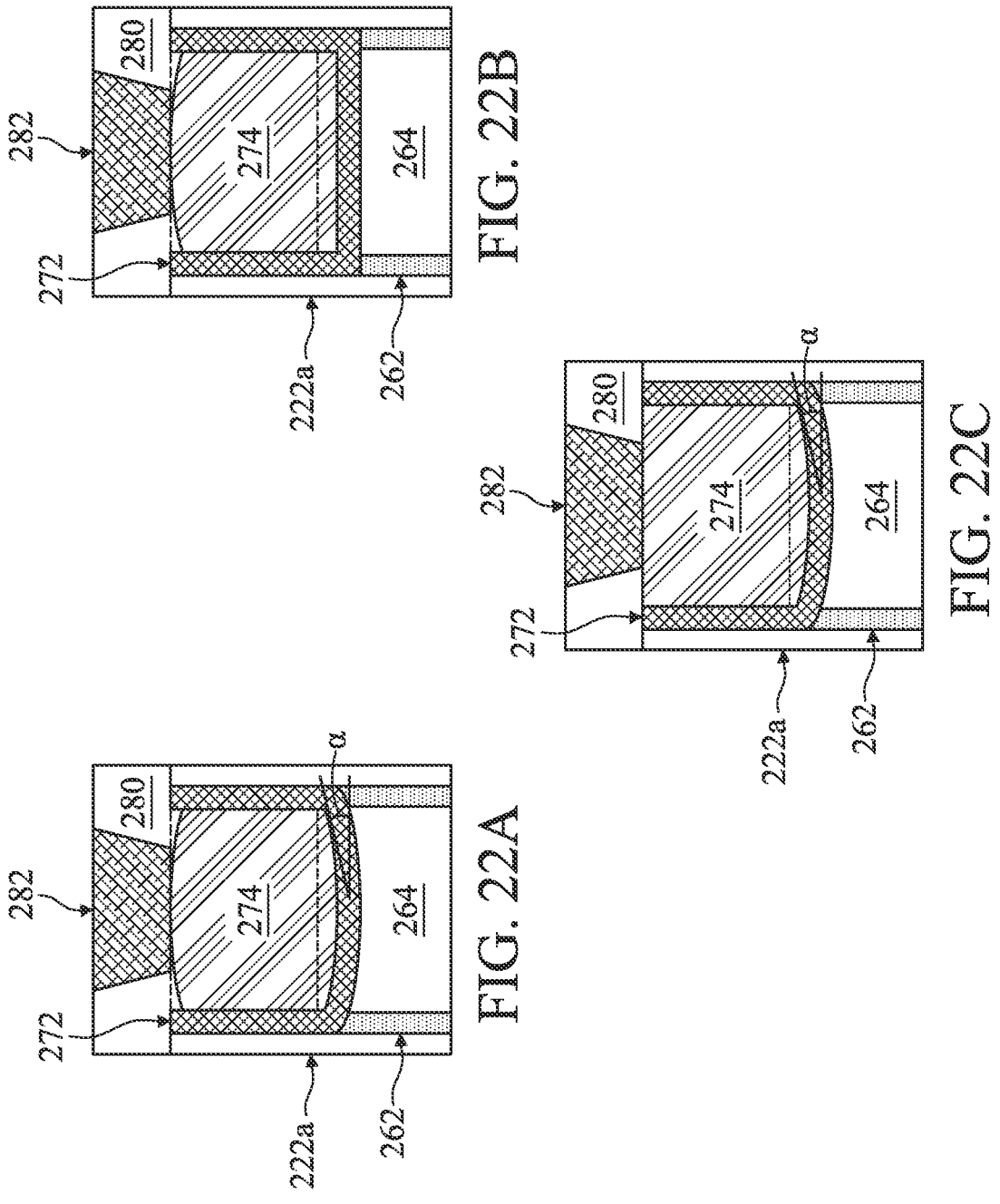

METAL CAPPING LAYER FOR REDUCING GATE RESISTANCE IN SEMICONDUCTOR DEVICES

CROSS-REFERENCE TO RELATED APPLICATION

This Non-Provisional application claims priority to U.S. Provisional Application Ser. No. 63/219,914, filed Jul. 9, 2021, and titled "Metal Capping Layer for Reducing Gate Resistance in Semiconductor Devices," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

Such scaling down has also increased the complexity of processing and manufacturing ICs and, for these advances to be realized, similar developments in IC processing and manufacturing are needed. For example, there are challenges associated with forming low-resistance metal gate structures at reduced length scales, such as in nanosheet field-effective transistors (NS FETs; also referred to as gate-all-around, or GAA, FETs). For at least this reason, improvements in this area are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are flow charts of an example method for fabricating an example semiconductor structure, according to some embodiments of the present disclosure.

FIG. 2 is a three-dimensional perspective view of the example semiconductor structure at intermediate stages of the example method as shown FIGS. 1A and/or 1B, according to some embodiments of the present disclosure.

FIGS. 3A, 4A, 5A, 6A, 7A, 8A, 9A, 10A, 11A, 12A, 15A, 16A, 17A, 20A, and 21A are cross-sectional views of the example semiconductor structure along line AA' as shown in FIG. 2 at intermediate stages of the example method as shown in FIGS. 1A and/or 1B, according to some embodiments of the present disclosure.

FIGS. 3B, 4B, 5B, 6B, 7B, 8B, 9B, 10B, 11B, 12B, 15B, 16B, 17B, 18A, 18B, 18C, 18D, 20B, 21B, 22A, 22B, 22C, 22D, and 22E are cross-sectional views of the example semiconductor structure along line BB' as shown in FIG. 2 at intermediate stages of the example method as shown in FIGS. 1A and/or 1B, according to some embodiments of the present disclosure.

Figure 13:
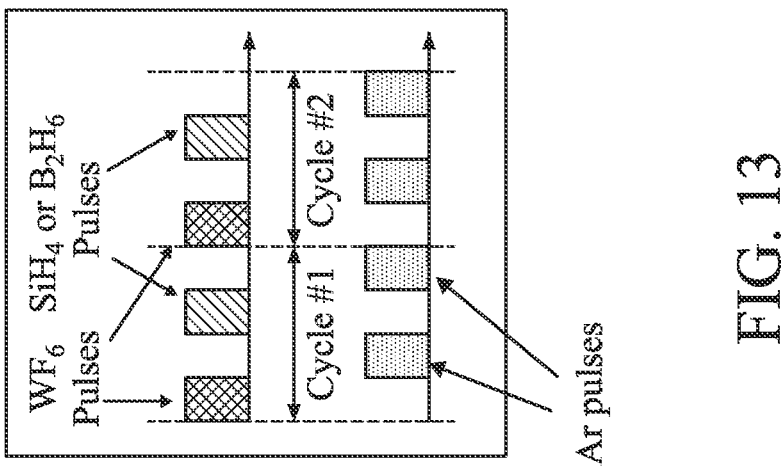

FIG. 13 is an example schematic plot of a deposition process employed by the example method as shown in FIGS. 1A and/or 1B, according to some embodiments of the present disclosure.

Figure 14:
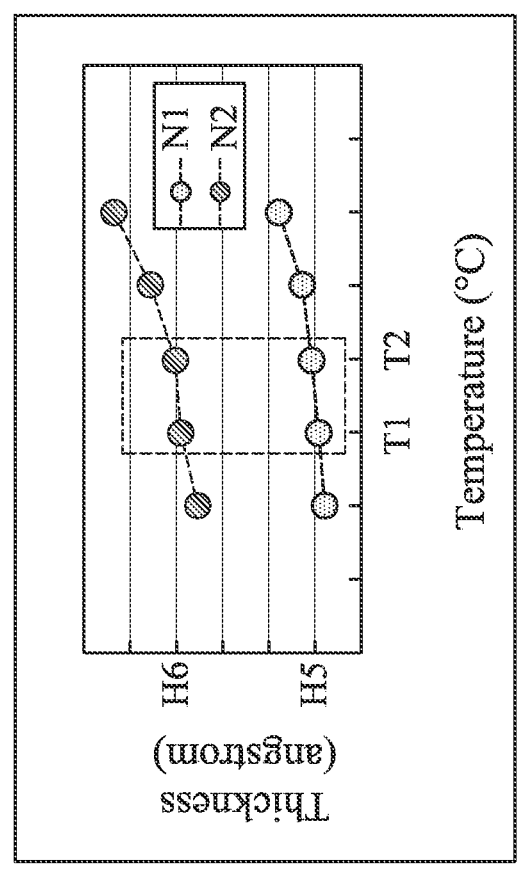

FIG. 14 is an example schematic plot illustrating change in film thickness as a function of processing temperature and number of cycles of a deposition process employed by the example method as shown in FIGS. 1A and/or 1B, according to some embodiments of the present disclosure.

Figure 19:
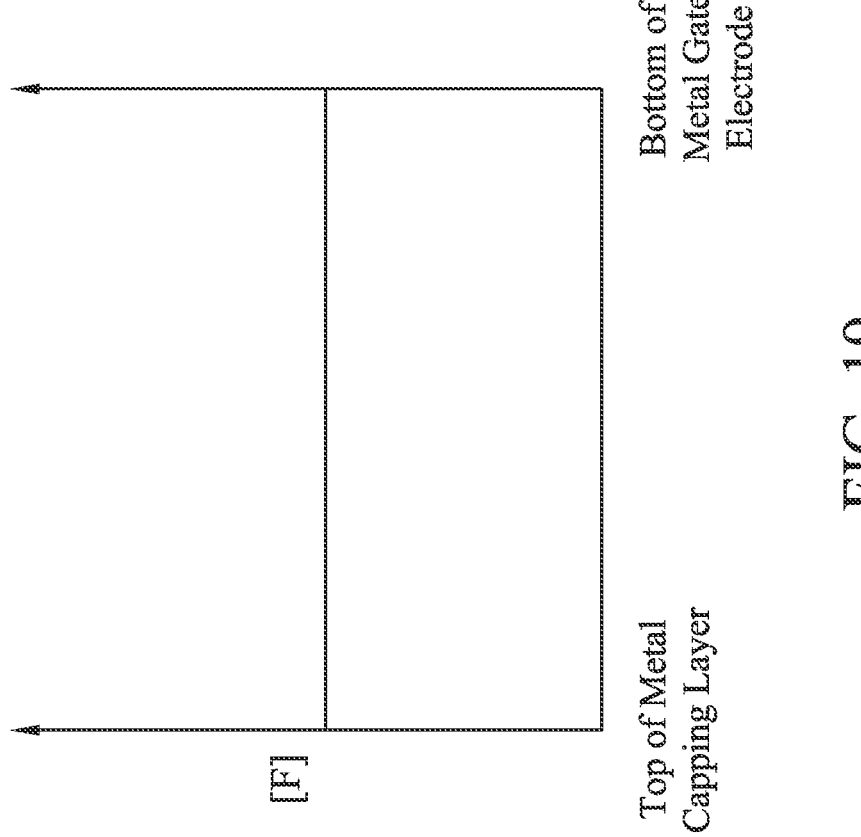

FIG. 19 is an example schematic plot illustrating concentration of fluorine in a portion of the example semiconductor structure as shown in one or more of FIGS. 2-12B, 15A-18D, and 20A-22E, according to some embodiments of the present disclosure.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional fin-like FETs (FinFETs), nanosheet (NS; also referred to as gate-all-around, or GAA) FETs, in memory and/or standard logic cells of an IC structure. Generally, an NS FET includes a plurality of vertically stacked sheets (e.g., nanosheets), wires (e.g., nanowires), or rods (e.g., nanorods) in a channel region of the FET. The present disclosure includes multiple embodiments. Different embodiments may have different advantages, and no particular advantage is necessarily required of any embodiment.

Advancement in fabrication of semiconductor devices has introduced many challenges. In one such example, the scaling down of various device features reduces volume available for gap-filling during the formation of a metal gate structure (or metal gate stack), which may result in higher gate resistance ($R_g$). While methods of reducing gate resistance in NS FETs and FinFETs have been generally adequate, they have not been entirely satisfactory in all aspects.

Referring to FIGS. 1A and 1B collectively, flowcharts of methods 100 and 150 of forming a semiconductor structure (hereafter simply referred to as the structure) 200 is illustrated according to various aspects of the present disclosure. Methods 100 and 150 are merely examples and are not intended to limit the present disclosure beyond what is explicitly recited in the claims. Additional operations can be provided before, during, and after method 100 and/or method 150, and some operations described can be replaced, eliminated, or moved around for additional embodiments of the method 100 and/or 150.

The structure 200 may be an intermediate device fabricated during processing of an IC, or a portion thereof, that may comprise static random-access memory (SRAM) and/or logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

At operation 102, referring to FIGS. 1A and 2A-4B, method 100 forms the structure 200 that includes multiple active three-dimensional device regions 204a and 204b (hereafter referred to as fins 204a and 204b) protruding from a semiconductor substrate 202 (hereafter referred to as the substrate 202). The structure 200 may include additional fins protruding from the substrate 202 and parallel to the fins 204a and 204b.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In some embodiments, referring to FIGS. 3A and 3B, each of the fins 204a and 204b includes a multi-layer structure (ML) of alternating non-channel layers (or sacrificial layers) 205 and channel layers 206 stacked vertically over protruding portions of the substrate 202, as well as a hard mask layer 207 over the ML. In the present embodiments, the non-channel layers 205 are sacrificial layers configured to be removed at a subsequent processing step, thereby providing openings between the channel layers 206 for forming a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layer 206 may include elemental Si and the non-channel layer 205 may include elemental Ge. In some examples, each of the fins 204a and 204b may include a total of three to ten pairs of alternating non-channel layers 205 and channel layers 206. Other configurations may also be applicable depending upon specific design requirements.

In the present embodiments, the hard mask layer 207 is a sacrificial layer configured to facilitate the formation of a gate isolation feature (discussed in detail below) and subsequently be removed from the structure 200. As such, a thickness of the hard mask layer 207 may be adjusted based on the desired thickness of the gate isolation feature. In some embodiments, the thickness of the hard mask layer 207 is greater than a thickness of the non-channel layers 205 and the channel layers 206. The hard mask layer 207 may include any suitable material, such as a semiconductor material, so long as its composition is different from that of the subsequently-formed gate isolation feature and the channel layer 206 disposed thereunder to allow selective removal by an etching process. In some embodiments, the hard mask layer 207 has a composition similar to or the same as that of the non-channel layers 205 and includes, for example, SiGe.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET. For embodiments in which the hard mask layer 207 has the same composition as the non-channel layers 205, the hard mask layer 207 may also be formed by a similar epitaxy process as discussed herein.

In some embodiments, as depicted in FIGS. 4A and 4B, each of the fins 204a and 204b includes a single semiconductor layer, i.e., having a uniform composition along a height of the fin, that protrudes from the substrate 202. The present disclosure is not limited by the configuration of the fins 204a and 204b. For embodiments in which the ML is employed, subsequent operation 104 is applied to the fins 204a and 204b before forming a dummy gate structure at operation 106. For embodiments in which the fins 204a and 204b each include a uniform composition, operation 104 may be omitted and the dummy gate structure may be formed over the fins 204a and 204b following operation 102.

In the present embodiments, the fins 204a and 204b are fabricated from the ML (and the hard mask layer 207 disposed thereover) and/or the substrate 202 using a series of photolithography and etching processes. For example, the photolithography process may include forming a photoresist layer overlying the structure 200, exposing the photoresist layer to a pattern, performing post-exposure bake processes, and developing the exposed photoresist layer to form a patterned masking element (not depicted). The ML and/or the substrate 202 are then etched using the patterned masking element as an etch mask, thereby leaving the fins 204*a* and 204*b* protruding from the substrate 202. The etching process may include dry etching, wet etching, reactive ion etching (RIE), other suitable processes, or combinations thereof. The patterned masking element is subsequently removed from the structure 200 using any suitable process, such as ashing and/or resist stripping.

Numerous other embodiments of methods to form the fins 204*a* and 204*b* may be suitable. For example, the fins 204*a* and 204*b* may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used to pattern the fins 204*a* and 204*b*.

Subsequently, method 100 at operation 102 forms isolation features 208 between the fins 204*a* and 204*b*, where a top surface of the isolation features 208 is below the bottommost non-channel layer 205. The isolation features 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation features 208 may include shallow trench isolation (STI) features. In some embodiments, the isolation features 208 are formed by filling trenches that separate the fins 204*a* and 204*b* with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. The isolation features 208 may include a single-layer structure or a multi-layer structure.

At operation 104, referring to FIGS. 1, 5A, and 5B, method 100 forms cladding layers 209 along sidewalls of the fins 204*a* and 204*b* and over the isolation features 208. In the present embodiments, the cladding layers 209 and the non-channel layers 205 are sacrificial layers configured to be replaced with a metal gate stack in a channel region of the fin 204. In the present embodiments, the cladding layers 209 have the same composition as the non-channel layers 205 and include SiGe. In some embodiments, the cladding layers 209 are grown epitaxially by a suitable method discussed above with respect to forming the ML. In some embodiments, the cladding layers 209 are deposited conformally, rather than grown epitaxially, over surfaces of the structure 200 as a blanket amorphous layer. In some examples, the cladding layers 209 may be formed to a thickness of about 5 nm to about 10 nm. Subsequently, method 100 performs an etching process to selectively remove portions of the cladding layer 209, thereby exposing portions of the isolation features 208 and a top surface of the hard mask layer 207. The etching process may include a dry etching process, a wet etching process, a reactive ion etching (RIE) process, or combinations thereof.

Figures 6A, 6B:

Referring to FIGS. 6A and 6B, method 100 at operation 104 forms a dielectric helmet 214 over the isolation features 208. In the present embodiments, forming the dielectric helmet 214 includes first forming a dielectric structure 211 over the isolation features 208. The dielectric structure 211 is configured to isolate adjacent fins 204*a* and 204*b* and to provide a substrate over which a dielectric helmet 214 is formed before forming the dummy gate structure. The dielectric structure 211 may include any suitable material, such as SiO and/or $SiO_2$, silicon nitride (SiN), silicon carbide (SiC), oxygen-containing silicon nitride (SiON), oxygen-containing silicon carbide (SiOC), carbon-containing silicon nitride (SiCN), FSG, a low-k dielectric material, other suitable materials, or combinations thereof. The dielectric structure 211 may include a single-layer structure or a multi-layer structure as depicted herein, where the dielectric structure 211 includes a sub-layer 211*b* disposed over a sub-layer 211*a*. In some embodiments, the dielectric structure 211 and the isolation features 208 differ in composition. The dielectric structure 211 (or each sub-layer thereof) may be deposited by any suitable method, such as CVD, FCVD, SOG, other suitable methods, or combinations thereof, and subsequently planarized by one or more CMP processes, such that a top surface of the dielectric structure 211 is substantially co-planar with a top surface of the hard mask layer 207.

Subsequently, method 100 forms the dielectric helmet 214 over the dielectric structure 211. The dielectric helmet 214 may include SiN, SiC, SiON, SiOC, SiCN, $Al_2O_3$, SiO and/or $SiO_2$, a high-k dielectric material (having a k value greater than that of silicon oxide, which is about 3.9), other suitable materials, or combinations thereof. In the present embodiments, the dielectric helmet 214 includes a high-k dielectric material for enhancing the etching resistance of the dielectric helmet 214 during the subsequent processing steps. The dielectric helmet 214 may include a single-layer structure or a multi-layer structure. In some embodiments, a dielectric constant of the dielectric helmet 214 is greater than that of the dielectric structure 211 and the isolation features 208. In some embodiments, portions of the dielectric helmet 214 are configured to truncate a metal gate stack into multiple portions. In this regard, the dielectric helmet 214 may be patterned to form one or more gate isolation features (or a gate cut feature) that are self-aligned with the underlying dielectric structure 211 and between fins 204*a* and 204*b*.

Method 100 may form the dielectric helmet 214 by first recessing a top portion of the dielectric structure 211 to form trenches, such that a top surface of the recessed dielectric structure 211 is substantially co-planar with the topmost channel layer 206. The etching process may include any suitable process, such as a dry etching process, a wet etching process, an RIE process, other suitable processes, or combinations thereof. Then, method 100 proceeds to depositing one or more dielectric materials in the trenches and performing a CMP process to form the dielectric helmet 214. The one or more dielectric materials may be deposited by any suitable method, such as CVD, FCVD, ALD, other suitable methods, or combinations thereof. Subsequently, method 100 removes the hard mask layer 207 from the structure 200 to expose the topmost channel layer 206 of the ML. As such, the dielectric helmet 214 protrude from top surfaces of the fins 204*a* and 204*b*. In the present embodiments, method 100 selectively removes the hard mask layer 207 without removing, or substantially removing, the dielectric helmet 214 and the topmost channel layer 206 of the ML.

Referring to FIGS. 1A, 7A, and 7B, method 100 at operation 106 forms a dummy (or placeholder) gate structure 220 over the fins 204a and 204b via a series of photolithography and etching processes, where the dummy gate structure 220 is subsequently replaced with a metal gate structure. The dummy gate structure 220 may include a dummy gate electrode (not depicted separately) disposed over an optional dummy gate dielectric layer and/or an interfacial layer (not depicted separately). The dummy gate electrode may include polysilicon (poly-Si), the dummy gate dielectric layer may include a suitable dielectric material (e.g., SiO and/or $SiO_2$, SiON, etc.), and the interfacial layer may include an oxide material (e.g., SiO and/or SiO2). Other materials may also be applicable for the present embodiments. Various layers of the dummy gate structure 220 may be formed by methods such as thermal oxidation, chemical oxidation, CVD, ALD, physical vapor deposition (PVD), plating, other suitable methods, or combinations thereof.

Referring to FIG. 7B, method 100 forms top gate spacers 222a on sidewalls of the dummy gate structure 220. The top gate spacers 222a may include a single-layer structure or a multi-layer structure and may include SiO and/or $SiO_2$, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. Each spacer layer of the top gate spacers 222a may be formed by first depositing a dielectric layer over the dummy gate structure 220 via a suitable deposition method (e.g., CVD and/or ALD) and subsequently removing portions of the dielectric layer in an anisotropic (e.g., directional) etching process (e.g., a dry etching process), leaving the top gate spacers 222a on the sidewalls of each dummy gate structure 220.

Referring to FIGS. 1A, 8A, and 8B, method 100 at operation 108 forms epitaxial source/drain (S/D) features 224 in the fins 204a and 204b and adjacent to the dummy gate structure 220. In the present embodiments, method 100 forms the epitaxial S/D features 224 by first forming S/D recesses (not depicted) in the S/D regions of the fins 204a and 204b, forming inner gate spacers 222b on sidewalls of the non-channel layers 205 that are exposed in the S/D recesses, and forming epitaxial S/D features 224 in the S/D recesses.

In the present embodiments, method 100 forms the S/D recesses by implementing an etching process that selectively removes portions of the fins 204a and 204b in the S/D regions. In some embodiments, the etching process is a dry etching process employing a suitable etchant capable of removing the channel layers 206 (e.g., Si) and the non-channel layers 205 (e.g., SiGe) of the ML. A cleaning process may subsequently be performed to clean the S/D recesses with a hydrofluoric acid (HF) solution or other suitable solution.

The inner gate spacers 222b may be a single-layer structure or a multi-layer structure and may include silicon oxide, SiN, SiCN, SiOC, SiON, SiOCN, a low-k dielectric material, air, a high-k dielectric material (e.g., $HfO_2$, $La_2O_3$, etc.), other suitable dielectric material, or combination thereof. In some embodiments, the inner gate spacers 222b have a composition different from that of the top gate spacers 222a. Forming the inner gate spacers 222b may include selectively removing portions of the non-channel layers 205 exposed in the S/D recesses without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206, thereby forming the inner gate spacers 222b. The one or more dielectric layers may be deposited by any suitable method, such as ALD, CVD, physical vapor deposition (PVD), other suitable methods, or combinations thereof.

Each of the epitaxial S/D features 224 may be suitable for forming a p-type MOS (PMOS) device (i.e., including a p-type epitaxial material) or, alternatively, an n-type MOS (NMOS) device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 222b. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the epitaxial S/D features 224.

Thereafter, referring to FIGS. 9A and 9B, method 100 at operation 110 replaces the dummy gate structure 220 with the metal gate structure 260. Method 100 first forms an etch-stop layer (ESL) 230 over the structure 200 to protect the underlying components, such as the epitaxial S/D features 224, during subsequent fabrication processes. The ESL 230 may include any suitable dielectric material, such as SiN, SiCN, $Al_2O_3$, other suitable materials, or combinations thereof, and may be formed by CVD, ALD, PVD, other suitable methods, or combinations thereof. In the present embodiments, the ESL 230 provides etching selectivity with respect to its surrounding dielectric components to ensure protection against inadvertent damage to these components. Method 100 then forms an interlayer dielectric (ILD) layer 232 over the ESL 230 to fill the space between portions of the dummy gate structure 220. The ILD layer 232 may include SiO and/or $SiO_2$, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate structure 220.

In some embodiments, before replacing the dummy gate structure 220, method 100 at operation 110 first patterns the dielectric helmet 214 such that at least a portion of the dielectric helmet 214 remain as gate isolation features for separating the subsequently-formed metal gate structure while remaining portions of the dielectric helmet 214 are removed from the structure 200. In some embodiments, method 100 patterns the dielectric helmet 214 by forming a patterned masking element (not depicted) to expose portions of the dummy gate structure 220 engaged with portions of the dielectric helmet 214 to be removed. The patterned masking element includes at least a photoresist layer capable of being patterned by a series of photolithography and etching processes discussed in detail above with respect to patterning the fins 204a and 204b. Thereafter, method 100 removes portions of the dummy gate structure 220 exposed by the patterned masking element to expose portions of the dielectric helmet 214 in an etching process (e.g., a dry etching process). After implementing the etching process, the patterned masking element is removed from the structure 200 by any suitable method, such as resist stripping and/or plasma ashing. The exposed portions of the dielectric helmet 214 are then selectively removed with respect to the dummy gate structure 220 in a suitable etching process (e.g., a dry etching process) to form the patterned dielectric helmet 214. In some embodiments, operation 112 is optional and the dielectric helmet 214 is patterned at a subsequent operation. In some embodiments, referring to FIG. 9A, the depicted portions of the dielectric helmet 214 are removed from the structure 200.

Subsequently, method 100 performs an etching process to remove the dummy gate structure 220 (or remaining portions thereof after patterning the dielectric helmet 214), thereby forming gate trenches (not depicted) between the top gate spacers 222a. The etching process may be a dry etching process, a wet etching process, an RIE process, other suitable processes, or combinations thereof. For embodiments in which the fins 204a and 204b each include the ML, method 100 then removes the cladding layers 209 to form vertical openings (not depicted) along the sidewalls of the channel layers 206 and removes the non-channel layers 205 to form horizontal openings (not depicted) interleaved with the channel layers 206. In some embodiments, method 100 implements separate etching processes to remove the cladding layers 209 and the non-channel layer 205. For example, method 100 may perform a first etching process to remove the cladding layers 209, resulting in vertical openings along the sidewalls of each of the fins 204a and 204b, and then perform a second etching process to remove the non-channel layers 205, resulting in horizontal openings interleaved with the channel layers 206. For embodiments in which the non-channel layers 205 and the cladding layers 209 have the same composition (e.g., SiGe), the first and the second etching processes may be implemented using the same etchant, such as a fluorine-containing etchant including hydrofluoric acid (HF), $F_2$, other fluorine-containing etchants (e.g., $CF_4$, $CHF_3$, $CH_3F$, etc.), or combinations thereof. For embodiments in which each fin 204a and 204b includes a single semiconductor layer, the process of removing the cladding layers 209 and the non-channel layer 205 are omitted.

Still referring to FIGS. 9A and 9B, method 100 then forms the metal gate structure 260 in the gate trenches, the vertical openings (if present), and the horizontal openings (if present). Accordingly, for embodiments in which the fins 204a and 204b each include the ML, portions of each of the metal gate structure 260 wrap around (or interleaved with) each channel layer 206 and extend along the sidewalls of the fins 204a and 204b.

In the present embodiments, still referring to FIGS. 9A and 9B, the metal gate structure 260 includes a gate dielectric layer 262 and a metal gate electrode 264 disposed over the gate dielectric layer 262. The gate dielectric layer 262 may include a high-k dielectric material, such as $HfO_2$, $La_2O_3$, other suitable materials, or combinations thereof. The metal gate electrode 264 includes a work function metal (WFM) layer (not depicted separately) and a bulk conductive layer (not depicted separately) disposed over the WFM layer. The WFM layer may include a p-type or an n-type WFM, such as TiN, TaN, WN, $ZrSi_2$, $MoSi_2$, $TaSi_2$, $NiSi_2$, Ti, TaAl, TaAlC, TiAlN, TaC, TaCN, TaSiN, other suitable work function metals, or combinations thereof. The bulk conductive layer may include Co, W, Ru, Cu, Al, Ti, Ni, Au, Pt, Pd, other suitable materials, or combinations thereof. In some embodiments, the metal gate electrode 264 includes an Al-containing WFM, such as TaAl, TaAlC, TiAlN, other Al-containing WFMs, or combinations thereof. In some embodiments, the metal gate electrode 264 does not include a bulk conductive layer due to the reduced gate dimension (e.g., gate length) resulting from increased device density. In other words, the WFM layer(s) may completely fill the gate trenches and the openings before forming the bulk conductive layer.

The metal gate structure 260 may further include other material layers (may not be depicted), such as an interfacial layer 261 disposed on surfaces of the channel layers 206, a capping layer, a barrier layer, other suitable layers, or combinations thereof. Various layers of the metal gate structure 260 may be formed by various methods including, for example, ALD, CVD, PVD, plating, other suitable methods, or combinations thereof. After forming the bulk conductive layer, one or more CMP processes are performed to remove excessive material formed on top surface of the ILD layer 232, thereby planarizing the structure 200.

Thereafter, method 100 at operation 112 forms a metal capping layer 274 over the metal gate structure 260. In the present embodiments, the metal capping layer 274 is formed by implementing method 150 depicted in FIG. 1B.

Figures 10A, 10B:
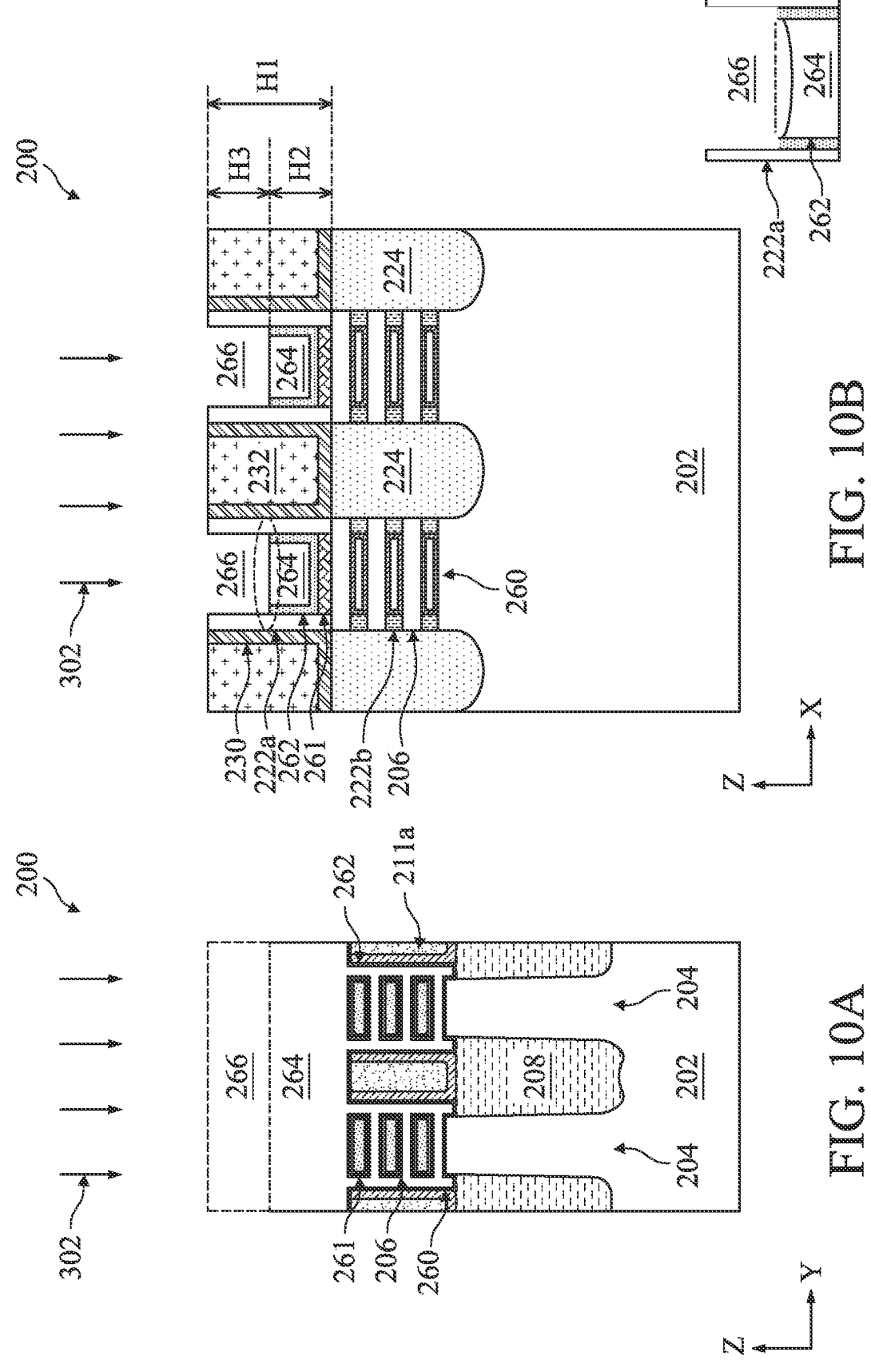

Referring to FIGS. 1B, 10A, and 10B, method 150 at operation 152 recesses the metal gate structure 260 to form a trench 266 in an etching process 302. The etching process 302 may be a dry etching process, a wet etching process, an RIE process, other suitable processes, or combinations thereof, and employ one or more etchant capable of removing various layers of the metal gate structure 260 without removing, or substantially removing, the surrounding dielectric components, such as the top gate spacers 222a, the ESL 230, and the ILD layer 232. In some embodiments, the etching process 302 results in a substantially flat top surface in the recessed metal gate structure 260, such as that depicted in FIG. 10B. In some embodiments, the etching process 302 results in a depressed (i.e., a concave or curved upward) top surface in the recessed metal gate structure 260, as depicted in an enlarged view of a portion of the structure 200 enclosed in the dashed circle in FIG. 10B. This may be caused by the fact that the etching rate of the gate dielectric layer 262 is slightly lower than that of the various layers of the metal gate electrode 264. In addition, the deposition of various layers of the metal gate electrode 264, e.g., the WFM layers, may result in a seam (similar to seam 273 depicted in FIG. 12B) within the layers, which may also contribute to the different etching rates within the metal gate structure 260. In the present embodiments, the depth of the trench 266 is controlled by adjusting etching parameters such as etching duration of the etching process 302.

In some embodiments, referring to FIG. 10B, a ratio of a height H2 of a remaining portion of the metal gate structure 260 to a total height H1 of the metal gate structure 260 before performing the etching process 302 is at least about 0.3. In some examples, the ratio may be about 0.3 to about 0.5. In some embodiments, a difference H3 between the height H2 and H1, which also defines the depth of the trench 266, is different from the height H1, i.e., the height H3 may be greater or less than the height H1. In some embodiments, the height H2 is substantially the same as the height H3. In some examples, the height H2 may be at least about 6 nm and the height H1 may be about 14 nm to about 18 nm. In further examples, the height H3 may be at least about 2 nm and no greater than about 12 nm. Other dimensions of the metal gate structure 260 may also be applicable in the present embodiments. Nevertheless, if the height H3 is too small, there may not be enough space for the subsequent deposition of glue layer (e.g., glue layer 272) and a metal capping layer (e.g., metal capping layer 274). On the other hand, an upper limit of the height H3 would only be dictated by the height H1 and the minimum height H2 of the remaining portion of the metal gate structure 260.

Figures 11A, 11B:
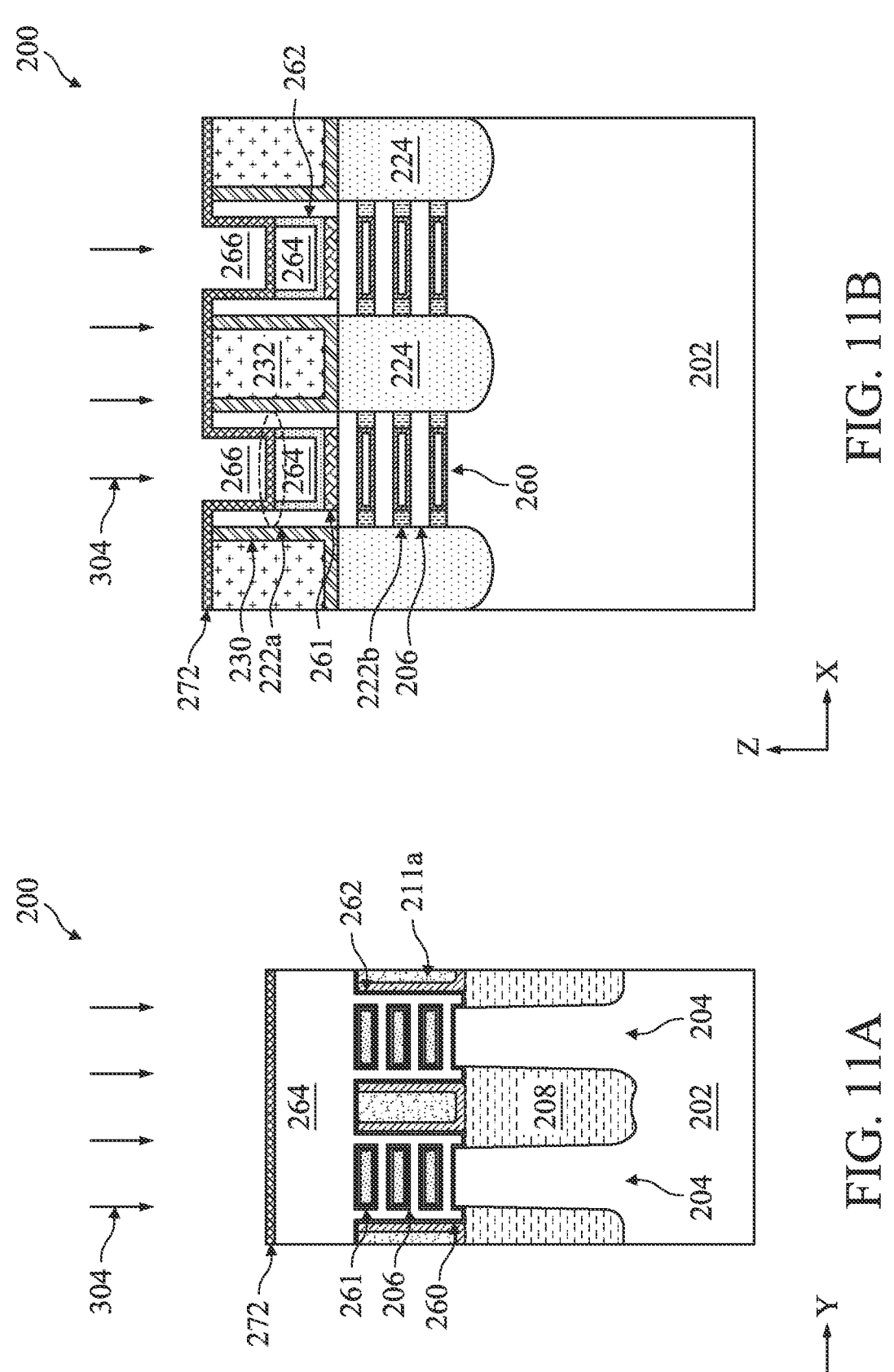

At operation 154, referring to FIGS. 1B, 11A and 11B, method 150 forms a glue layer (or an adhesion layer) 272 over the structure 200 in a deposition process 304. In the present embodiments, the glue layer 272 includes a nitrogen-containing material, such as TiN, TaN, or a combination thereof. In the present embodiments, the glue layer 272 is deposited conformally over the structure such that it is formed along sidewall and bottom surfaces of the trench 266 as well as a top surface of the ILD layer 232. In some embodiments, the deposition process 304 is an ALD process. In some embodiments, the glue layer 272 is formed to a thickness of about 1 nm to about 1.5 nm.

Subsequently, method 150 may proceed to operation 156 to form the metal capping layer 274 or alternatively, to operations 158 and 160 to form the metal capping layer 274.

Figures 12A, 12B:
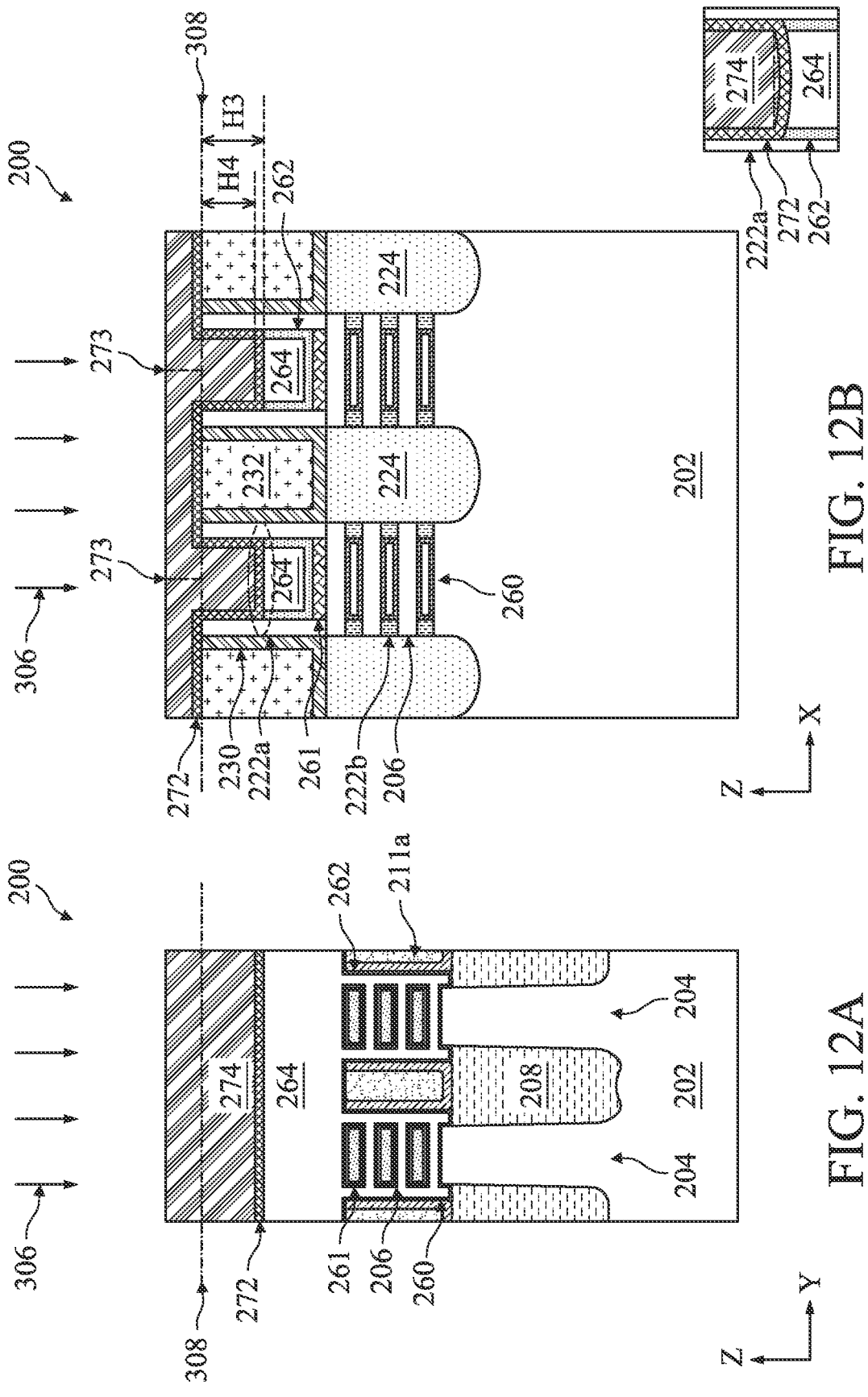

In some embodiments, referring to FIGS. 12A and 12B, method 150 at operation 156 performs a deposition process 306 to form the metal capping layer 274 over the glue layer 272, thereby filling the trench 266 and forming a portion of the metal capping layer 274 over the top surface of the ILD layer 232. In the present embodiments, the metal capping layer 274 includes a conductive material configured to reduce resistance of the metal gate structure 260. In some embodiments, the metal capping layer 274 includes a low-resistance metal, such as W. In some embodiments, the metal capping layer 274 has a composition that is the same as the bulk conductive layer included in the metal gate structure 260. In some embodiments, the metal capping layer 274 has a composition that is different from the bulk conductive layer included in the metal gate structure 260. Other low-resistance metals that may be contemplated in the present disclosure include Rh, Ir, Ru, Co, Cu, Ag, other suitable metals, or combinations thereof. In some embodiments, the metal capping layer 274 includes a metal that has lower resistance than the metal included in the bulk conductive layer of the metal gate structure 260.

In the present embodiments, the deposition process 306 grows the metal capping layer 274 over an entirety of the glue layer 272, including the bottom and sidewall surfaces of the trench 266, thus completely filling the trench 266. In this regard, the deposition process 306 is not a selective deposition process that grows the metal capping layer 274 in a bottom-up configuration. In some embodiments, the portion of the metal capping layer 274 formed in the trench 266 is defined by a thickness H4, which is a difference between the height H3 (FIG. 10B) and the thickness of the glue layer 272. In some embodiments, the thickness of the glue layer 272 is at least about 1 nm to prevent peeling between the metal capping layer 274 and the metal gate structure 260. In some embodiments, the metal capping layer 274 is defined by a thickness (i.e., the height H3) that is greater than the thickness of the glue layer 272. In some embodiments, the thickness H4 is at least about 1 nm and less than about 11 nm. Furthermore, still referring to FIG. 12B, the deposition process 306 may result in the formation of a seam 273 disposed within a portion of the metal capping layer 274 above the top surface of the ILD layer 232, which is subsequently removed by a planarization process.

In the present embodiments, the deposition process 306 is an ALD process that employs tungsten hexafluoride ($WF_6$) as a precursor gas in the following Reaction I:

$$B_2H_6 + 2WF_6 \rightarrow 2W + 2BF_3 + 6HF \qquad \text{(Reaction I)},$$

where $B_2H_6$ is a reducing gas and argon (Ar) is a carrier (or purging) gas for the reaction. In some embodiments, a different reducing gas, such as $SiH_4$, is used in the reduction of $WF_6$ to form W in the metal capping layer 274 in the following Reaction II:

$$SiH_4 + 2WF_6 \rightarrow 2W + SiHF_6 + 6HF \qquad \text{(Reaction II)}.$$

In the present embodiments, both Reactions I and II are spontaneous reactions that provide W in metallic form. In some embodiments, hydrogen gas ($H_2$) is optionally used in addition to $B_2H_6$ or $SiH_4$ as a reducing gas to increase the rate of Reaction I or Reaction II, respectively. It is noted, however, that using $H_2$ alone would not complete either Reaction I or Reaction II as provided herein. Both Reactions I and II may be implemented where the temperature of the precursor gas is at room temperature (e.g., about 20° C. to about 25° C.), the processing temperature is about 275° C. to about 300° C., and the processing pressure is about 5 Torr to about 30 Torr. Other deposition parameters may also be applicable in the present embodiments.

FIG. 13 illustrates an example schematic of an ALD process applicable in the present embodiments. To form the metal capping layer 274 that contains W, alternating pulses of the precursor gas (e.g., $WF_6$) and reducing gas (e.g., $B_2H_6$ or $SiH_4$ with optional $H_2$) are applied to the structure 200 in an ALD chamber to initiate the reaction (e.g., Reaction I or Reaction II) for forming W, followed by application of a purging gas (e.g., Ar) to remove any reaction by-product (e.g., $BF_3$, HF, and/or $SiHF_3$). One cycle of deposition is completed after each set of alternating pulses of the precursor gas and the reducing gas is applied. Additional cycles may be repeated to increase a thickness (e.g., the thickness H4) of the metal capping layer 274. In other words, the thickness of the metal capping layer 274 increases with increasing number of deposition cycles. For example, referring to FIG. 14, at a fixed processing temperature, increasing the number of deposition cycle from N1 to N2, increases the thickness of the metal capping layer 274 from H5 to H6. In addition, the thickness of the metal capping layer 274 also increases with increasing processing temperature. This may be demonstrated by the upward trend of each curve corresponding to the cycle numbers N1 and N2, respectively, as a function of temperature. However, within the range between a temperature T1 and a temperature T2, e.g., between about 275° C. and about 300° C., the change in thickness as a function of temperature is negligible, indicating that such is a suitable range of processing temperature for implementing the deposition process 306. In some examples, a cycle number N1 of 4 corresponds to a thickness H5 of about 2 nm and a cycle number N2 of 10 corresponds to a thickness H6 of about 8 nm. Other cycle numbers and thicknesses may also be applicable for the present embodiments.

Figures 17A, 17B:
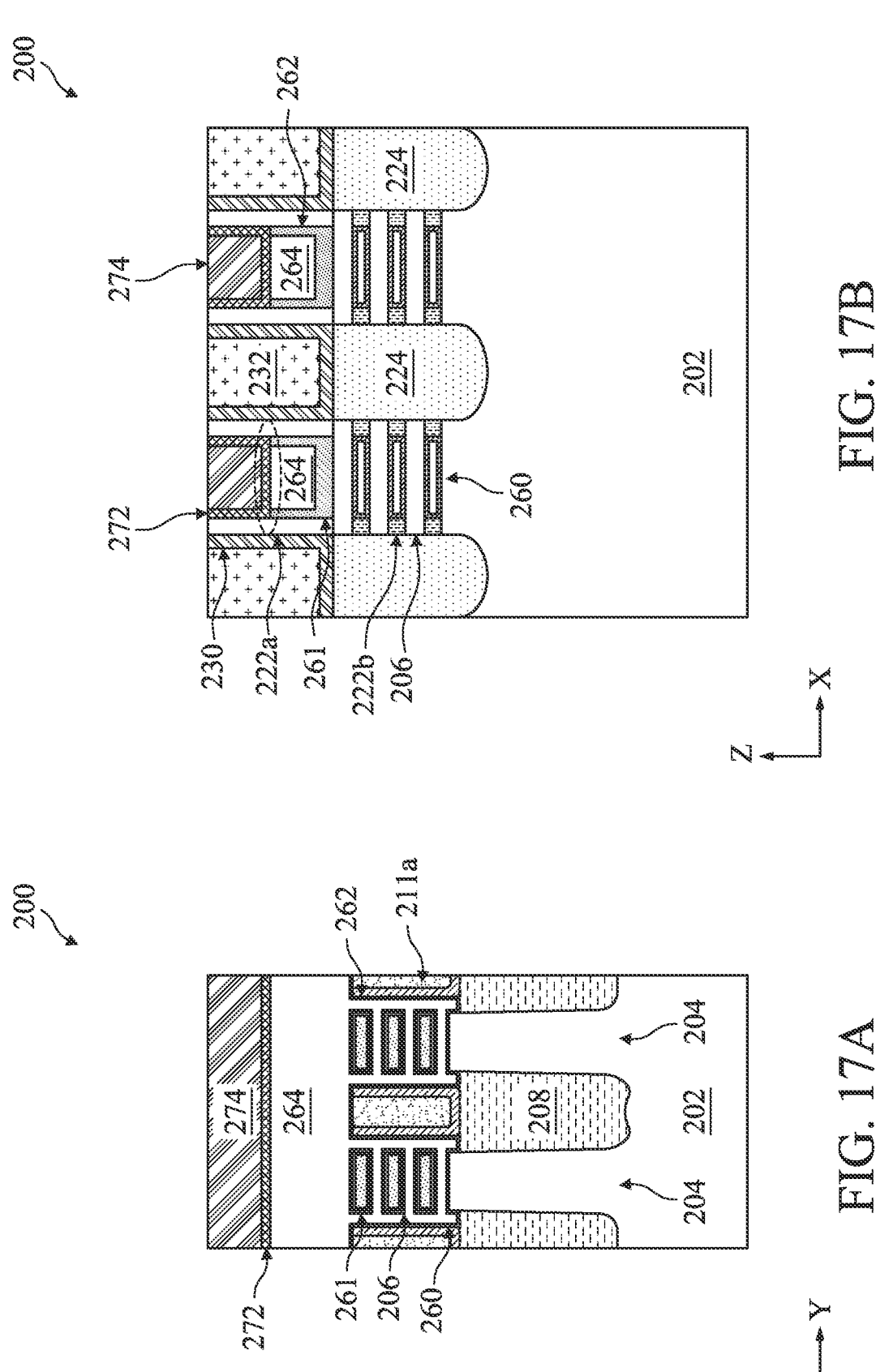

Thereafter, referring again to FIGS. 12A and 12B, method 150 proceeds from operation 156 to operation 162 by performing a planarization process 308 to remove portions of the glue layer 272 and the metal capping layer 274 formed over the top surface of the ILD layer 232 (i.e., along the depicted dotted line), thereby completing the formation of the metal capping layer 274. Referring to FIGS. 17A and 17B, the planarization process 308 results in at least a portion of the metal capping layer 274 to be planar with the ILD layer 232. In the present embodiments, the planarization process 308 is a CMP process.

Figure 15B:
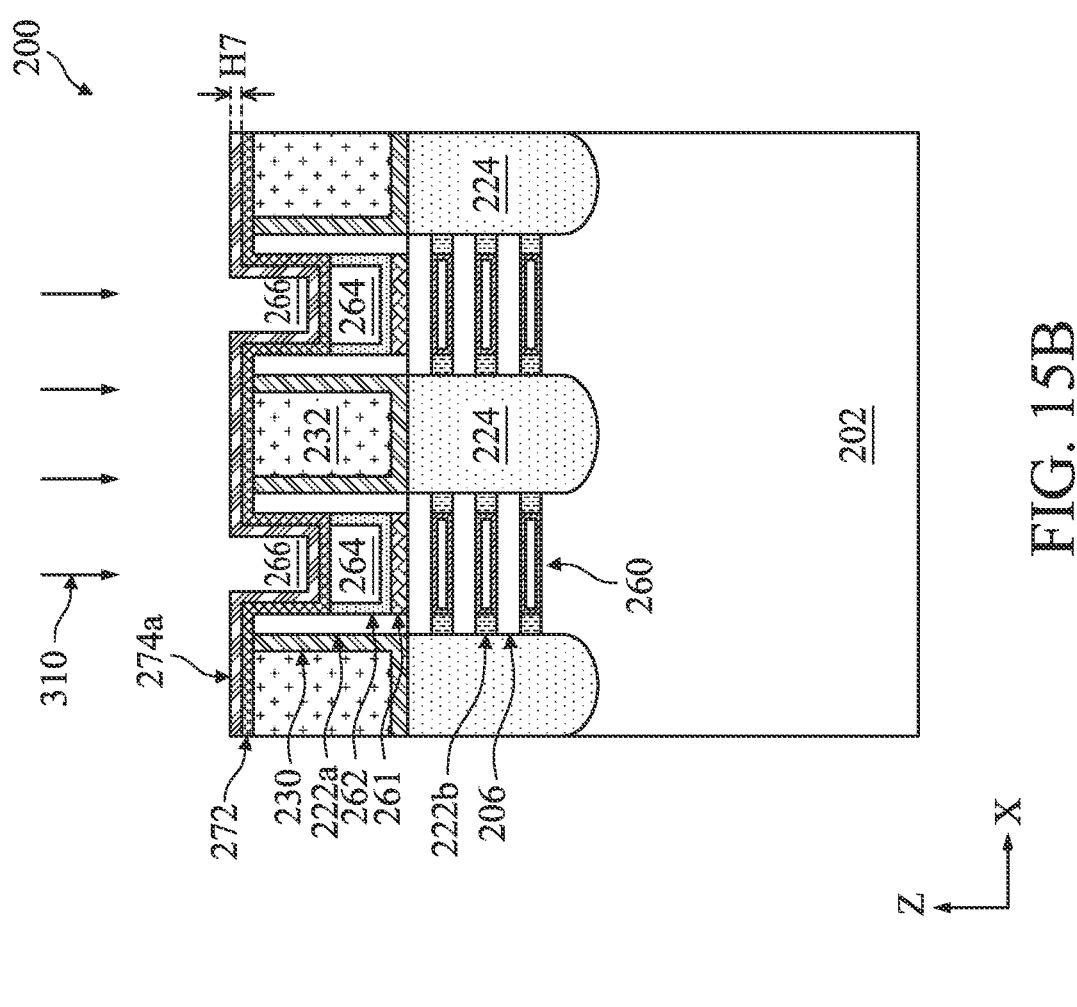
Figure 15A:
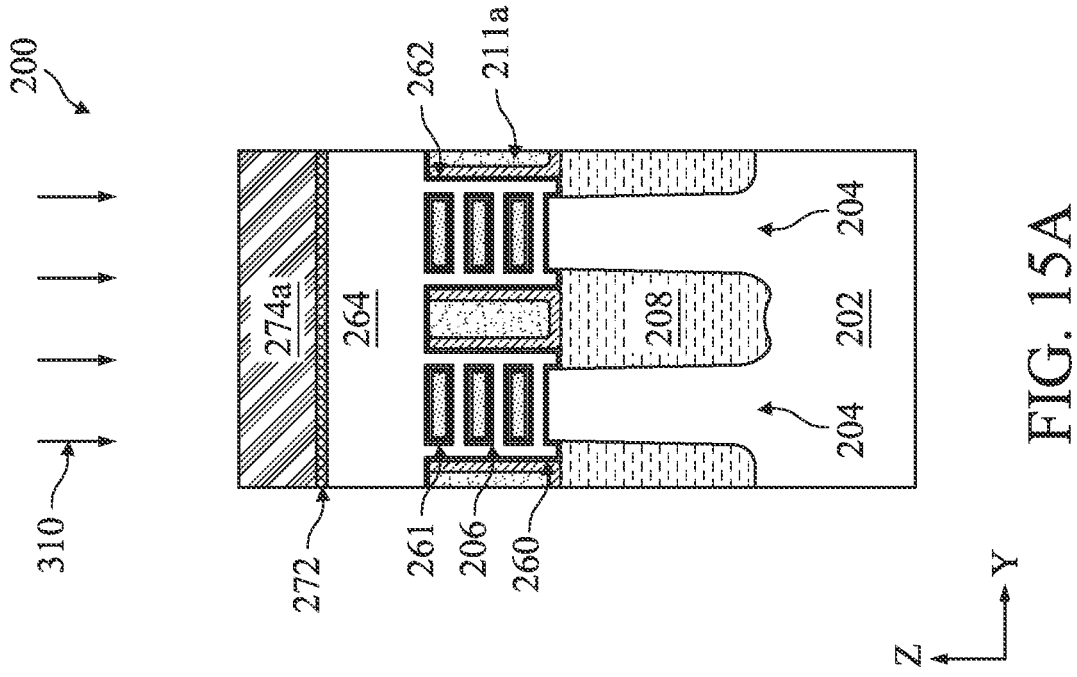

In some embodiments, referring to FIGS. 15A and 15B, method 150 proceeds from operation 154 to operation 158 by performing a deposition process 310 to form a first portion 274a of the metal capping layer 274 in a deposition process 310. In the present embodiments, the first portion 274a has the same composition as the metal capping layer 274 discussed in detail above with respect to FIGS. 12A and 12B. For example, the first portion 274a includes a conductive material such as W. In the present embodiments, the deposition process 310 is an ALD process similar to the deposition process 306. In this regard, the deposition process 310 may employ Reaction I or Reaction II to form the first portion 274a as discussed in detail above. However, the deposition process 310 differs from the deposition process 306 in that the deposition process 310 is configured to form the first portion 274a as a seed layer, which only partially, rather than completely, fills the trench 266. In other words, the first portion 274a has a thickness that is less than the thickness H4 defined above. In some embodiments, the first portion 274a is formed to a thickness H7 that is greater than the thickness of the glue layer 272. In some examples, the thickness H7 may be about 2 nm to about 3 nm. Accordingly, the duration of the deposition process 310 is controlled to be less than the duration of the deposition process 306 to ensure that the first portion 274a partially fills the trench 266.

Figures 16A, 16B:
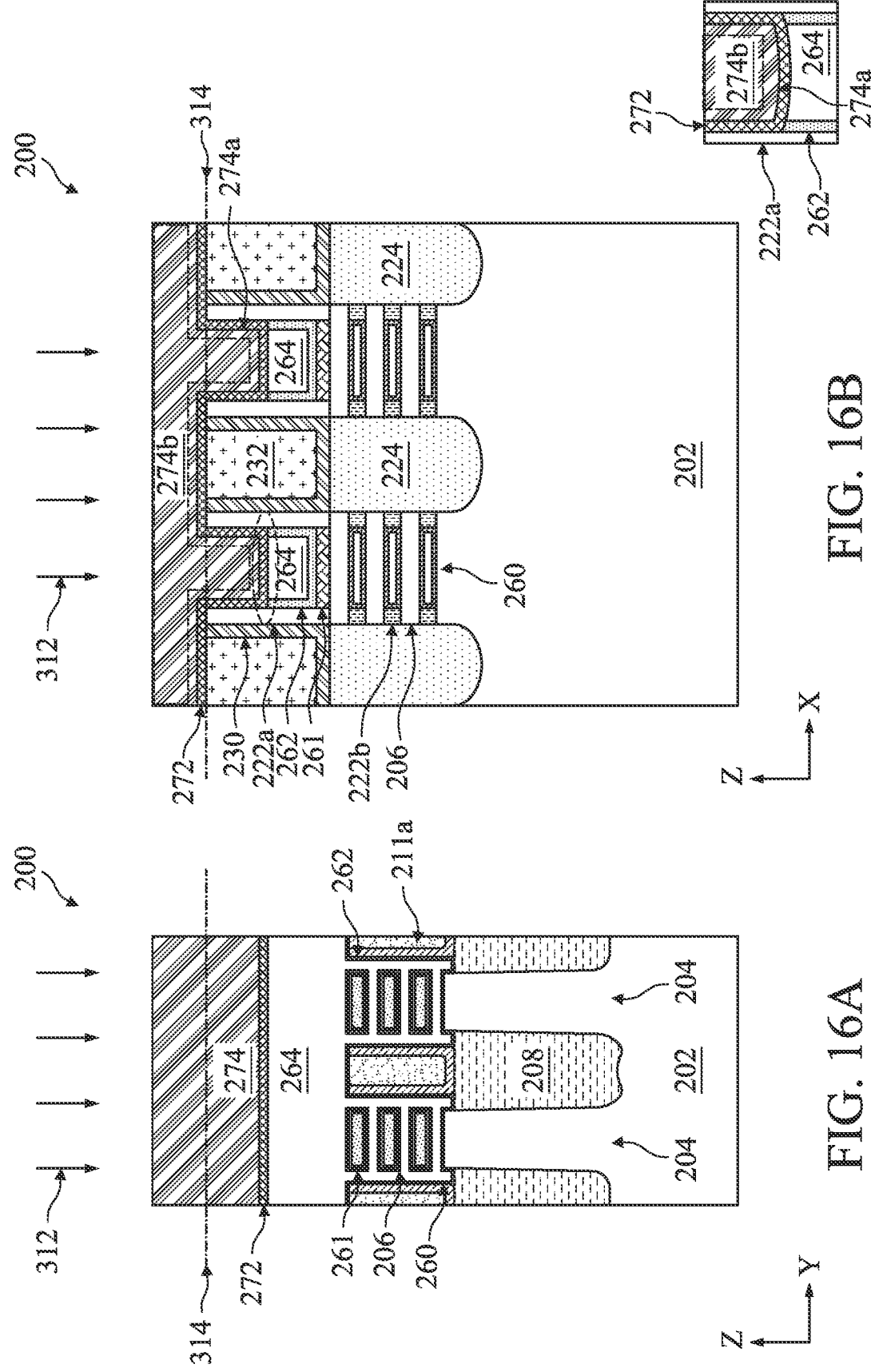

Subsequently, referring to FIGS. 16A and 16B, method 150 at operation 160 forms a second portion 274b over the first portion 274a in a deposition process 312, thereby forming the metal capping layer 274 to completely fill the trench 266. In some embodiments, the second portion 274b is formed to a thickness that is greater than the thickness H7. In the present embodiments, the deposition process 312 is a CVD process that employs tungsten hexafluoride ($WF_6$) as a precursor gas in the following Reaction III:

$$3H_2+WF_6 \rightarrow W+6HF \qquad \text{(Reaction III)},$$

where $H_2$ is the reducing gas and Ar is the carrier gas. Reaction III may be implemented where the temperature of the precursor gas is at room temperature (e.g., about 20° C. to about 25° C.), the processing temperature is about 275° C. to about 300° C., and the processing pressure is about 250 Torr to about 300 Torr. It is noted that the processing pressure of Reactions I and II is less than that of Reaction III due to the fact that the ALD process is generally a self-limiting process and thus does not require as high of a processing pressure than the CVD process. Other deposition parameters may also be applicable in the present embodiments. Similar to Reactions I and II, the reaction by-produce of Reaction III, i.e., HF, is removed from the deposition chamber by the purging gas Ar. Different from Reactions I and II, $H_2$ may be used as the lone reducing gas for Reaction III to ensure that the deposition process 312 proceeds in a suitable rate.

In some embodiments, the rate of Reaction III is less than that of Reactions I and II. However, because the ALD process proceeds in a layer-by-layer manner, the overall duration of forming the metal capping layer 274 by Reaction I or Reaction II may be longer than that by Reaction III. In this regard, for a relatively deeper trench 266, it may reduce the overall duration of deposition to implement a combination of the deposition processes 310 and 312 (at operations 158 and 160) rather than to implement the deposition process 306 (at operation 154) alone. In some examples, if the depth H3 of the trench 266 is greater than about 3 nm, implementing the combination of the deposition processes 310 and 312 may require less time than implementing the deposition process 306 alone. It is noted, however, that any of the Reactions I, II, and III, or combinations thereof, is applicable in the present embodiments and that the composition and structure of the resulting metal capping layer 274 does not vary with the specific deposition process(es) employed.

Thereafter, method 150 proceeds from operation 160 to operation 162 by performing a planarization process 314 to remove portions of the glue layer 272, the first portion 274a, and the second portion 274b formed over the top surface of the ILD layer 232, thereby completing the formation of the metal capping layer 274. The planarization process 314 may be a CMP process similar to the planarization process 308 in that the planarization process 314 may implement similar CMP slurries as the planarization process 308 and result in at least a portion of the metal capping layer 274 to be planar with the ILD layer 232 as depicted in FIGS. 17A and 17B.

FIGS. 18A-18D each depict an embodiment of a portion of the structure 200 enclosed in dashed circle as shown in FIG. 17B. In some embodiments, referring to FIGS. 18A, 18C, and 18D, due to the top surface of the trench 266 having a concave profile (see FIG. 10B), i.e., curved upward, a bottom surface of the metal capping layer 274 (and the glue layer 272) conforms to such concave profile. In the present embodiments, the concave profile is defined by an angle α with respect to a horizontal reference line, where the angle α is greater than about 0 degree to about 50 degrees. In some embodiments, referring to FIG. 18B, the angle α is approximately 0 degree, i.e., the bottom surface of the glue layer 272 is substantially flat.

In some embodiments, Referring to FIGS. 18A, 18B, and 18D, a top surface of the metal capping layer 274 is curved downward, i.e., having a convex profile, where a highest point of the top surface is substantially planar with the top surface of the top gate spacers 222a and the ILD layer 232, as indicated by a horizontal dashed line. The convex profile may be defined by an angle β with respect to the horizontal reference line, where the angle β may be similar to the angle α, i.e., greater than about 0 degree to about 50 degrees. The curved top surface may result from a slurry implemented during the planarization process 308 or 314 reacting with sidewall portions to a greater extent than with a center portion of the metal capping layer 274, causing more of the metal capping layer 274 to be removed near its interface with the glue layer 272. In some instances, referring to FIG. 18D, the selective removal may cause void (or air gap) 276 that penetrate along the interface and expose upper portions of the sidewalls of the metal capping layer 274. In some embodiments, the extent of the selective removal by the planarization process 308 or 314 is controlled by adjusting various parameters of the CMP process including, for example, composition of the slurry. In some embodiments, referring to FIG. 18C, the top surface of the metal capping layer 274 is substantially planar with the top surface of the top gate spacers 222a and the ILD layer 232.

In the present embodiments, the metal capping layer 274 provides a low-resistance interface between the metal gate structure 260 and a subsequently-formed gate contact feature (e.g., gate contact 282), thereby improving the overall device performance of the structure 200. While existing methods of reducing gate resistance have been generally adequate, they have not been entirely satisfactory in all aspects. In some examples, methods of forming a metal capping layer (e.g., a W-containing metal capping layer) may include performing a selective deposition process directly over the metal gate structure to form the metal capping layer in a bottom-up configuration. However, should the selectivity be lost during the deposition process, quality of the resulting capping layer may be compromised, thereby adversely affecting the device performance. In addition, the selective deposition process may incur greater production cost than a non-selective deposition, such as the ALD and/or the CVD process provided herein.

Furthermore, in the present embodiments, residual fluorine (F) atoms from dangling bonds of the precursor (e.g., $WF_6$) and/or the reaction by-products (e.g., $SiHF_3$, $BF_3$, and/or HF) of Reactions I, II, or III diffuse from the metal capping layer 274 to the metal gate structure 260. FIG. 19 illustrates an example schematic of the diffusion (or concentration profile) of F as a function of diffusion distance from the metal capping layer 274 to the metal gate structure 260. Specifically, the F atoms, due to their small atomic size, may diffuse through the glue layer 272 and selectively bond with Al atoms included in the WFM layers of the metal gate electrode 264. As a result, the F atoms anchor and stabilize the Al atoms in the metal gate electrode 264, thereby improving the reliability of the structure 200. In some examples, the F atoms may prevent the diffusion of Al atoms in an n-type FET (NFET) to an adjacent p-type FET (PFET), which may inadvertently affect the threshold voltage of the FETs. In the present embodiments, the F atoms is present throughout the metal gate electrode 264, i.e., having a substantially constant concentration ([F]), once an equilibrium of diffusion is reached.

In the present embodiments, the forming of the metal (e.g., the W-containing) capping layer 274 is non-selective. It is noted, however, that a W-containing capping layer may be formed by a selective deposition process (i.e., having obvious difference in incubation time between growth on a metal substrate and on a dielectric substrate) that requires a chlorine (Cl)-containing precursor, such as $WCl_5$, rather than the F-containing precursor $WF_6$ employed in the present embodiments. Because Cl atoms are larger than F atoms in size, there is greater hindrance associated with diffusion of the Cl atoms through the glue layer 272, and the benefits of improving the device's reliability may not be readily realized. In addition, such selective deposition process may be more costly, require additional treatment process to avoid loss of selectivity during the deposition process, and require a pristine growth substrate when compared to using a non-selective deposition process such as that discussed in the present embodiments.

After completing the formation of the metal capping layer 274 at operation 162, method 100 proceeds from operation 112 to operation 114 to form a gate contact 282 over the metal capping layer 274 according to FIGS. 1A and 20A-22E.

Figures 20A, 20B:
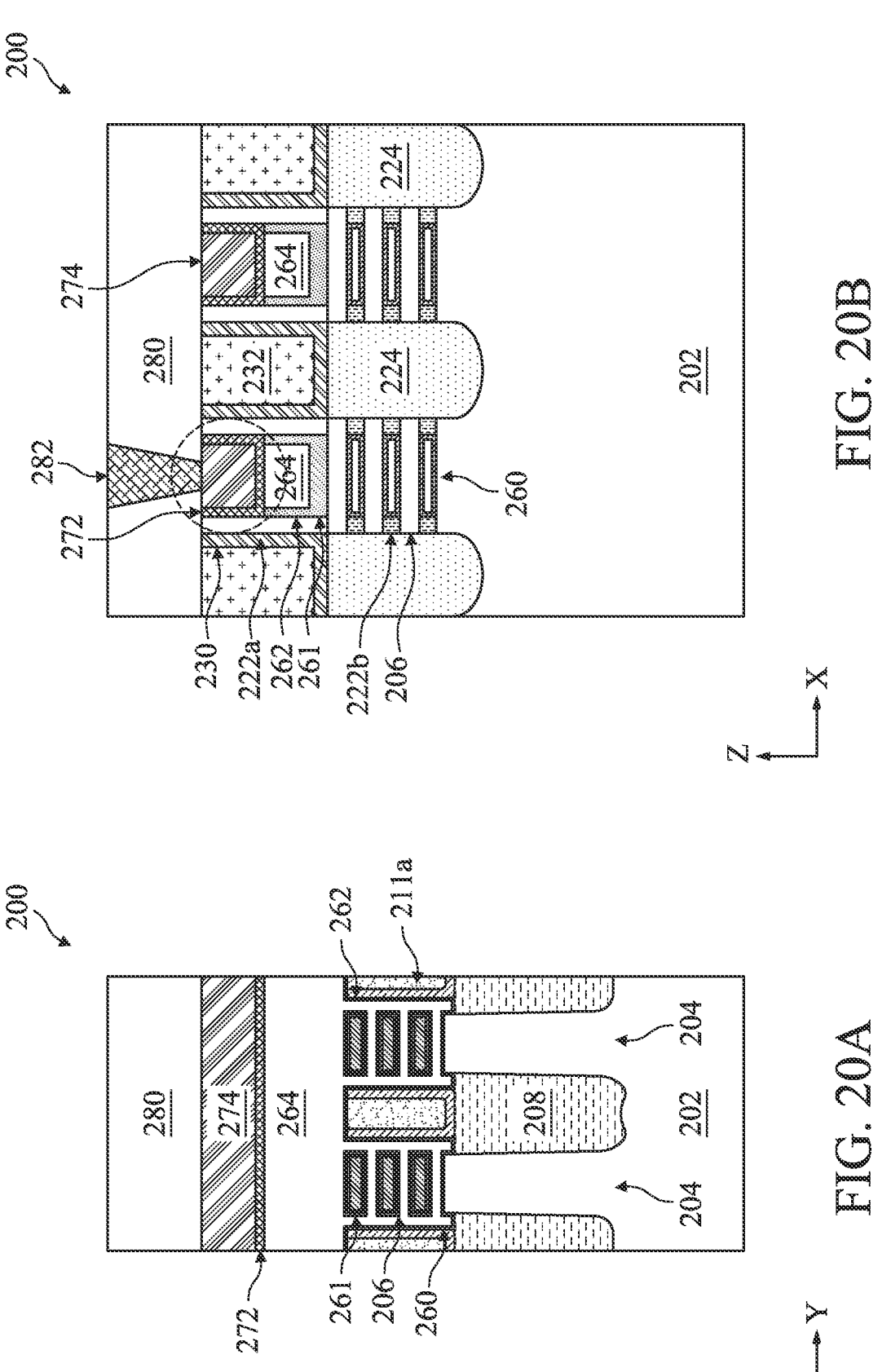
Figure 21B:
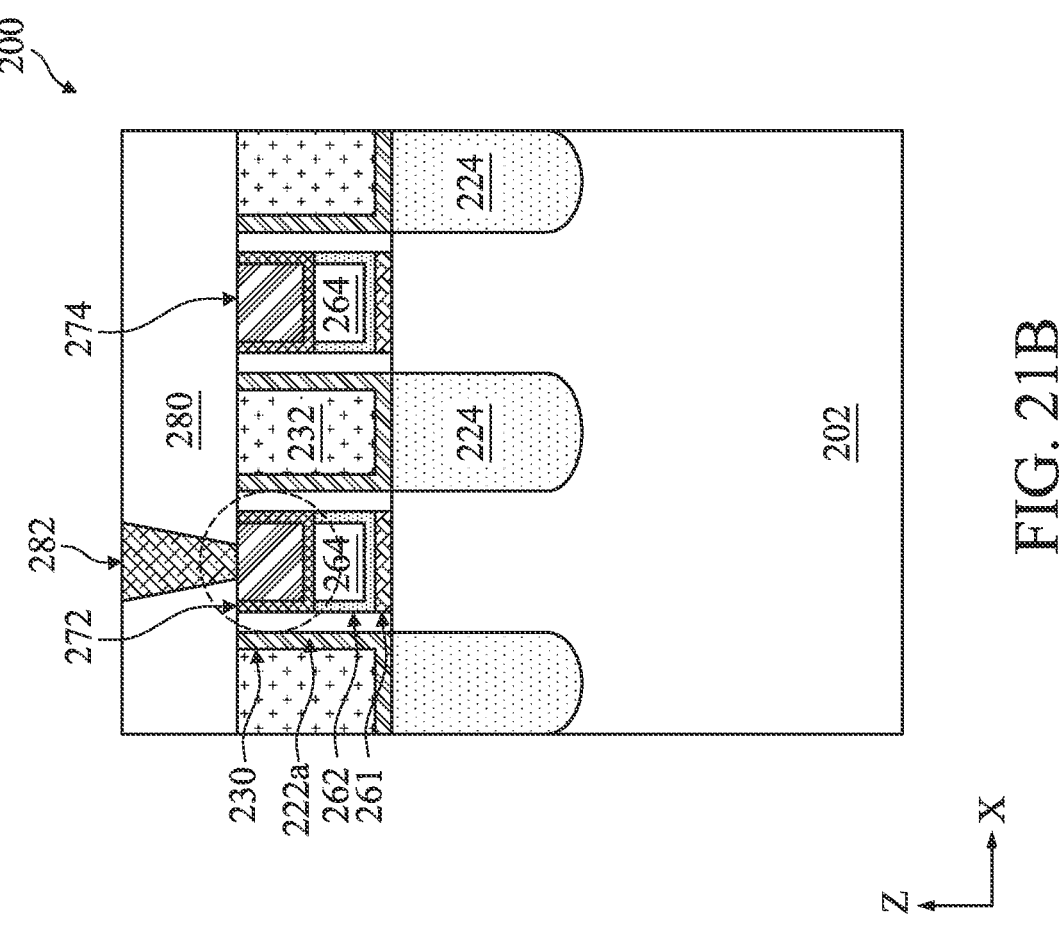
Figure 21A:
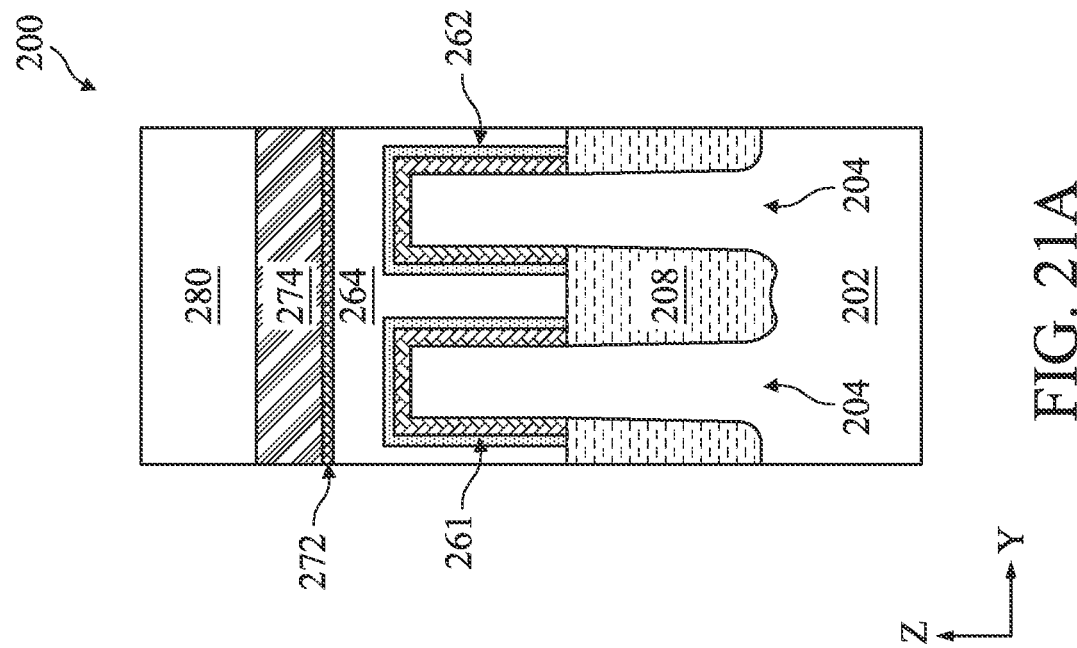

Referring to FIGS. 20A-21B, where FIGS. 20A and 20B depict an embodiment with each fin 204a-204b having the ML and FIGS. 21A and 21B depict an embodiment with each fin 204a-204b having a uniform composition, method 100 forms the gate contact 282 in an ILD layer 280. In the present embodiments, the gate contact 282 is configured to connect the metal gate structure 260 with one or more subsequently-formed interconnect structure (e.g., a conductive line). In some embodiments, though not depicted, the gate contact 282 includes a bulk conductive layer disposed over a barrier layer, where the bulk conductive layer may include Cu, W, Al, Co, Ru, other suitable materials, or combinations thereof and the barrier layer may include Ti, Ta, TiN, TaN, WN, other suitable materials, or combinations thereof. In some embodiments, the gate contact 282 includes additional material layer(s), such as a seed layer. In some embodiments, the barrier layer is omitted from the gate contact 282. In some embodiments, the ILD layer 280 is similar to or substantially the same as the ILD layer 232 in terms of composition and method of formation.

Method 100 may form the gate contact 282 by first forming the ILD layer 280 over the structure 200, forming a patterned masking element (not depicted) over the ILD layer 280 to expose a portion of the metal capping layer 274, subsequently etching the ILD layer 280 using the patterned masking element as an etch mask to expose a portion of the metal capping layer 274 in a contact opening (not depicted), forming the material layers of the gate contact 282 in the contact opening, and performing one or more CMP process to planarize the top surface of the structure 200. In some embodiments, an ESL (not depicted) is formed over the structure 200 before forming the ILD layer 280, where the ESL may have a composition similar to or substantially the same as that of the ESL 230. The various material layers of the gate contact 282 may be formed by methods including, for example, CVD, PVD, ALD, plating, other suitable methods, or combinations thereof.

Figure 22E:
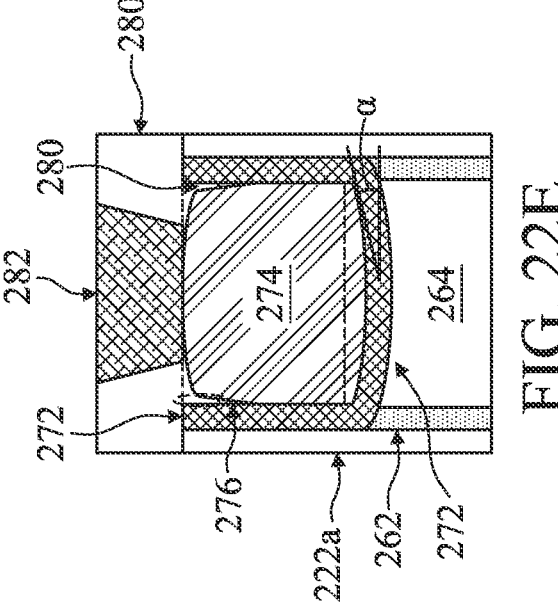
Figure 22D:
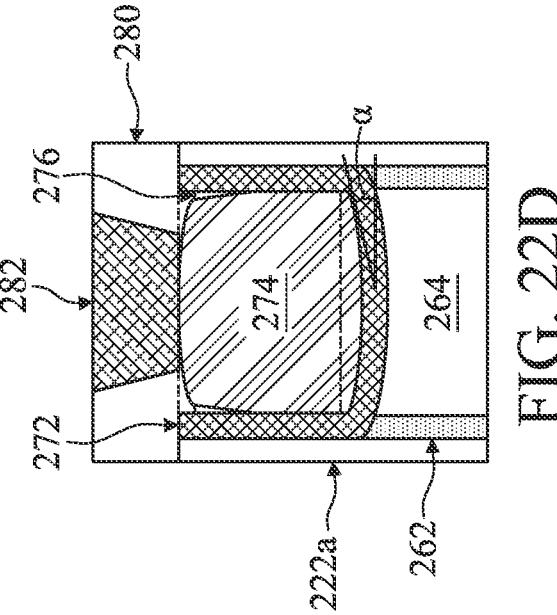

FIGS. 22A-22C each correspond to FIGS. 18A-18C and depict an embodiment of a portion of the structure 200 that includes the metal capping layer 274 and the gate contact 282. Various features of the metal capping layer 274 including the curved bottom surface and the curved top surface are shown in FIGS. 22A-22C as discussed in detail above. In this regard, referring to FIGS. 22A and 22B, the ILD layer 280 conforms to the curved top surface of the metal capping layer 274. FIGS. 22D and 22E both correspond to FIG. 18D in which the voids 276 are formed along the sidewalls of the metal capping layer 274 as a result of the planarization process 308 or 314. In some embodiments, referring to FIG. 22D, the ILD layer 280 is formed over the curved top surface of the metal capping layer 274 but is not formed to fill, or substantially fill, the voids 276. In some embodiments, referring to FIG. 22E, the ILD layer 280 is formed over the curved top surface of the metal capping layer 274 and partially fills or penetrates the voids 276, as indicated by a portion of the ILD layer 280 enclosed in dashed circle.

Thereafter, method 100 at operation 116 performs additional fabrication processes to the structure 200, such as forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact (not depicted) or the gate contact 282, with a conductive line or interconnect different conductive lines, which are horizontal interconnect features. The ESLs and the ILD layers of the MLI may have substantially same compositions as those discussed above with respect to the ESL 230 and the ILD layer 232, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Different embodiments may provide different benefits, and not all benefits are required for any specific embodiment. The present disclosure provides methods of a metal capping layer over a top surface of a metal gate structure to reduce the overall Rg of the metal gate structure. In the present embodiments, the metal capping layer comprises a low-resistance metal, such as tungsten (W). In some embodiments, a glue layer is first formed over the metal gate structure to accommodate the formation of the metal capping layer. In some embodiments, the formation of the metal capping layer is implemented using fluorine-containing precursor, such as $WF_6$, during an ALD and/or a CVD process. In further embodiments, residual F atoms from the deposition process(es) diffuse into the underlying metal gate structure and provide improvement in device reliability. Methods and structures of the present disclosure may be applicable in three-dimensional devices including FinFETs and NS FETs, for example.

In one aspect, the present embodiments provide a semiconductor structure that includes a semiconductor fin protruding from a substrate; a gate structure engaging with the semiconductor fin. The semiconductor structure also includes an interlayer dielectric (ILD) layer disposed over the substrate and adjacent to the gate structure, where a top surface of the gate structure is below a top surface of the ILD layer; a first metal layer in direct contact with a top surface of the gate structure; a second metal layer disposed over the first metal layer, where the first metal layer is disposed on bottom and sidewall surfaces of the second metal layer, where the bottom surface of the second metal layer has a concave profile, and where the second metal layer differs from the first metal layer in composition; and a gate contact disposed over the second metal layer.

In another aspect, the present embodiments provide a semiconductor structure that includes a fin extending from a semiconductor substrate; a gate stack disposed over a channel region of the fin; a glue layer in contact with a top surface of the gate stack; a tungsten (W)-containing capping layer disposed over the glue layer, where the glue layer surrounds bottom and sidewall surfaces of the W-containing capping layer. The semiconductor structure also includes a contact feature disposed on a top surface of the W-containing capping layer.

In yet another aspect, the present embodiments provide a method that includes forming a fin protruding from a semiconductor substrate; forming source/drain features in the fin; forming a metal gate structure over the fin and interposed between the source/drain features; recessing the metal gate structure to form a trench; depositing a first metal layer to partially fill the trench; depositing a second metal layer to completely fill the trench, where the second metal layer differs from the first metal layer in composition, and where the second metal layer includes tungsten (W); and planarizing the second meal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor fin protruding from a substrate;
a gate structure engaging with the semiconductor fin;
an interlayer dielectric (ILD) layer disposed over the substrate and adjacent to the gate structure, wherein a top surface of the gate structure is below a top surface of the ILD layer;
a first metal layer in direct contact with the top surface of the gate structure, wherein a middle portion of a bottom surface of the first metal layer is lower than a side portion of the bottom surface of the first metal layer;
a second metal layer disposed over the first metal layer, wherein the first metal layer is disposed on bottom and sidewall surfaces of the second metal layer, wherein the bottom surface of the second metal layer has a curved profile, wherein a topmost surface of the first metal layer is away from a top surface of the second metal layer, and wherein the second metal layer differs from the first metal layer in composition; and
a gate contact disposed over the second metal layer.

2. The semiconductor structure of claim 1, wherein a top surface of the second metal layer has a convex profile.

3. The semiconductor structure of claim 1, further comprising a second ILD layer disposed over the second metal layer, wherein a portion of the second ILD layer is sandwiched between the first metal layer and the second metal layer.

4. The semiconductor structure of claim 1, wherein the first metal layer and the bottom surface of the second metal layer form an angle that is greater than 0 degree and less than 50 degrees.

5. The semiconductor structure of claim 1, wherein the first metal layer includes TiN, TaN, or a combination thereof,
wherein the first metal layer has a top surface and the bottom surface curved toward a same direction.

6. The semiconductor structure of claim 1, wherein the second metal layer includes tungsten (W).

7. The semiconductor structure of claim 1, further comprising:
a dielectric layer disposed around the gate contact, and
an air gap disposed between a sidewall of the first metal layer and a sidewall of the second metal layer, wherein the dielectric layer is exposed to the air gap.

8. The semiconductor structure of claim 1, at least a portion of the top surface of the second metal layer is coplanar with the top surface of the ILD layer.

9. A semiconductor structure, comprising:
a fin extending from a semiconductor substrate;
a gate stack disposed over a channel region of the fin;
a glue layer in contact with a top surface of the gate stack;
a tungsten (W)-containing capping layer disposed over the glue layer, wherein the glue layer surrounds bottom and sidewall surfaces of the W-containing capping layer; and
a contact feature disposed on a top surface of the W-containing capping layer,
wherein the glue layer and the W-containing capping layer sandwich an air gap.

10. The semiconductor structure of claim 9, wherein the fin includes a plurality of semiconductor layers, and wherein a bottom portion of the gate stack is interleaved with the plurality of semiconductor layers.

11. The semiconductor structure of claim 9, wherein the W-containing capping layer and the gate stack both include fluorine (F) atoms.

12. The semiconductor structure of claim 11, wherein the gate stack includes aluminum (Al), and wherein the F atoms selectively bond with the Al in the gate stack.

13. The semiconductor structure of claim 9, wherein a thickness of the glue layer is less than a thickness of the W-containing capping layer.

14. The semiconductor structure of claim 9, wherein the top surface of the W-containing capping layer is curved, wherein a top surface of the glue layer is higher than a portion of the top surface of the W-containing capping layer.

15. The semiconductor structure of claim 9, further comprising:

an interlayer dielectric (ILD) layer over the W-containing capping layer, wherein the contact feature is disposed in the ILD layer; and an air gap enclosed by the ILD layer, the glue layer, and the W-containing capping layer.

16. A semiconductor structure, comprising:

a semiconductor active region;

a gate structure disposed over the semiconductor active region;

a gate spacer disposed along a sidewall of the gate structure;

a glue layer disposed on a top surface of the gate structure and interfacing the gate spacer;

a metal capping layer disposed over the glue layer and spaced apart from the gate spacer by the glue layer; and a gate contact disposed over the metal capping layer, wherein a first top surface and a bottom surface of the glue layer are curved toward a first direction, wherein a top surface of the metal capping layer is curved toward a second direction opposite to the first direction, wherein the top surface of the metal capping layer includes a middle portion and two side portions on two sides of the middle portion, wherein the middle portion interfaces with the gate contact, and the two side portions are spaced apart from and at a level lower than a bottom surface of the gate contact.

17. The semiconductor structure of claim 16, further comprising an interlayer dielectric (ILD) layer disposed over the metal capping layer and adjacent to the gate contact, wherein a portion of the ILD layer extends to below a second top surface of the glue layer and be between the glue layer and the metal capping layer.

18. The semiconductor structure of claim 16, wherein a second top surface of the glue layer is above at least a portion of a top surface of the meta capping layer, wherein the second top surface of the glue layer is discontinuous from the first top surface of the glue layer.

19. The semiconductor structure of claim 16, further comprising a dielectric layer sandwiched between a top surface of the metal capping layer and a bottom surface of the gate contact.

20. The semiconductor structure of claim 16, wherein a second top surface of the glue layer has a flat profile and interfaces with a dielectric layer.

\*    \*    \*    \*    \*